(12) United States Patent
Matsui et al.

(10) Patent No.: US 7,609,977 B2
(45) Date of Patent: Oct. 27, 2009

(54) OPTICAL TRANSMISSION USING SEMICONDUCTOR OPTICAL AMPLIFIER (SOA)

(75) Inventors: Yasuhiro Matsui, Lawrence, MA (US); Daniel Mahgerefteh, Somerville, MA (US); Xueyan Zheng, Andover, MA (US); Kevin McCallion, Charlestown, MA (US); Parviz Tayebati, Boston, MA (US)

(73) Assignee: Finisar Corporation, Sunnyvale, CA (US)

( * ) Notice: Subject to any disclaimer, the term of this patent is extended or adjusted under 35 U.S.C. 154(b) by 140 days.

(21) Appl. No.: 11/894,509

(22) Filed: Aug. 20, 2007

(65) Prior Publication Data
US 2008/0159751 A1 Jul. 3, 2008

Related U.S. Application Data

(63) Continuation-in-part of application No. 11/787,163, filed on Apr. 13, 2007, and a continuation-in-part of application No. 11/441,944, filed on May 26, 2006, now Pat. No. 7,492,976, and a continuation-in-part of application No. 11/272,100, filed on Nov. 8, 2005, now Pat. No. 7,477,851, and a continuation-in-part of application No. 11/084,630, filed on Mar. 18, 2005, now Pat. No. 7,406,266, and a continuation-in-part of application No. 11/068,032, filed on Feb. 28, 2005, now Pat. No. 7,555,225, and a continuation-in-part of application No. 11/037,718, filed on Jan. 18, 2005, now Pat. No. 7,536,113, and a continuation-in-part of application No. 10/308,522, filed on Dec. 3, 2002.

(60) Provisional application No. 60/838,548, filed on Aug. 18, 2006.

(51) Int. Cl.
*H04B 10/04* (2006.01)

(52) U.S. Cl. .................... 398/201; 398/195
(58) Field of Classification Search ............. 398/185, 398/201
See application file for complete search history.

(56) References Cited

U.S. PATENT DOCUMENTS

| 3,324,295 | A | 6/1967 | Harris |
| 3,999,105 | A | 12/1976 | Archey et al. |

(Continued)

FOREIGN PATENT DOCUMENTS

EP 602659 * 6/1994

(Continued)

OTHER PUBLICATIONS

Alexander et al., Passive Equalization of Semiconductor Diode Laser Frequency Modulation, Journal of Lightwave Technology, Jan. 1989, 11-23, vol. 7, No. 1.

(Continued)

*Primary Examiner*—Leslie Pascal
(74) *Attorney, Agent, or Firm*—Workman Nydegger

(57) ABSTRACT

A fiber optic communication system is disclosed having an optical signal source adapted to produce an amplitude and frequency modulated signal encoding binary data wherein high intensity 1 bits are red shifted relative to lower intensity 0 bits. The amplitude and frequency modulated signal is transmitted through a semiconductor optical amplifier (SOA), which may operate in saturation. An optical spectrum reshaper (OSR) is adapted to reshape the output of the SOA.

20 Claims, 23 Drawing Sheets

U.S. PATENT DOCUMENTS

| | | | |
|---|---|---|---|
| 4,038,600 | A | 7/1977 | Thomas et al. |
| 4,561,119 | A | 12/1985 | Epworth |
| 4,805,235 | A | 2/1989 | Henmi |
| 4,841,519 | A | 6/1989 | Nishio |
| 5,293,545 | A | 3/1994 | Huber |
| 5,325,378 | A | 6/1994 | Zorabedian |
| 5,371,625 | A | 12/1994 | Wedding et al. |
| 5,412,474 | A | 5/1995 | Reasenberg et al. |
| 5,416,629 | A | 5/1995 | Huber |
| 5,465,264 | A | 11/1995 | Buhler et al. |
| 5,477,368 | A | 12/1995 | Eskildsen et al. |
| 5,550,667 | A | 8/1996 | Krimmel et al. |
| 5,737,104 | A | 4/1998 | Lee et al. |
| 5,777,773 | A | 7/1998 | Epworth et al. |
| 5,805,235 | A | 9/1998 | Bedard |
| 5,856,980 | A | 1/1999 | Doyle et al. |
| 5,920,416 | A | 7/1999 | Beylat et al. |
| 5,953,139 | A | 9/1999 | Nemecek et al. |
| 5,974,209 | A | 10/1999 | Cho et al. |
| 6,081,361 | A | 6/2000 | Adams et al. |
| 6,096,496 | A | 8/2000 | Frankel |
| 6,104,851 | A | 8/2000 | Mahgerefteh |
| 6,115,403 | A | 9/2000 | Brenner et al. |
| 6,222,861 | B1 | 4/2001 | Kuo et al. |
| 6,271,959 | B1 | 8/2001 | Kim et al. |
| 6,298,186 | B1 | 10/2001 | He |
| 6,331,991 | B1 | 12/2001 | Mahgerefteh |
| 6,359,716 | B1 | 3/2002 | Taylor |
| 6,473,214 | B1 | 10/2002 | Roberts et al. |
| 6,506,342 | B1 | 1/2003 | Frankel |
| 6,577,013 | B1 | 6/2003 | Glenn et al. |
| 6,618,513 | B2 | 9/2003 | Evankow, Jr. |
| 6,654,564 | B1 | 11/2003 | Colbourne et al. |
| 6,665,351 | B2 | 12/2003 | Hedberg et al. |
| 6,748,133 | B2 | 6/2004 | Liu et al. |
| 6,778,307 | B2 | 8/2004 | Clark |
| 6,810,047 | B2 | 10/2004 | Oh et al. |
| 6,836,487 | B1 | 12/2004 | Farmer et al. |
| 6,847,758 | B1 | 1/2005 | Watanabe |
| 6,947,206 | B2 | 9/2005 | Tsadka et al. |
| 6,963,685 | B2 | 11/2005 | Mahgerefteh et al. |
| 7,013,090 | B2 | 3/2006 | Adachi et al. |
| 7,054,538 | B2 | 5/2006 | Mahgerefteh et al. |
| 7,076,170 | B2 | 7/2006 | Choa |
| 7,123,846 | B2 | 10/2006 | Tateyama et al. |
| 7,263,291 | B2 | 8/2007 | Mahgerefteh et al. |
| 7,280,721 | B2 | 10/2007 | McCallion et al. |
| 2002/0154372 | A1 | 10/2002 | Chung et al. |
| 2002/0159490 | A1 | 10/2002 | Karwacki |
| 2002/0176659 | A1 | 11/2002 | Lei et al. |
| 2003/0002120 | A1 | 1/2003 | Choa |
| 2003/0067952 | A1 | 4/2003 | Tsukiji et al. |
| 2003/0099018 | A1 | 5/2003 | Singh et al. |
| 2003/0147114 | A1 | 8/2003 | Kang et al. |
| 2003/0193974 | A1 | 10/2003 | Frankel et al. |
| 2004/0008933 | A1 | 1/2004 | Mahgerefteh et al. |
| 2004/0008937 | A1 | 1/2004 | Mahgerefteh et al. |
| 2004/0036943 | A1 | 2/2004 | Freund et al. |
| 2004/0096221 | A1 | 5/2004 | Mahgerefteh et al. |
| 2004/0218890 | A1 | 11/2004 | Mahgerefteh et al. |
| 2005/0100345 | A1 | 5/2005 | Welch et al. |
| 2005/0111852 | A1 | 5/2005 | Mahgerefteh et al. |
| 2005/0175356 | A1 | 8/2005 | McCallion et al. |
| 2005/0206989 | A1 | 9/2005 | Marsh |
| 2005/0271394 | A1 | 12/2005 | Whiteaway et al. |
| 2005/0286829 | A1 | 12/2005 | Mahgerefteh et al. |
| 2006/0002718 | A1 | 1/2006 | Matsui et al. |
| 2006/0018666 | A1 | 1/2006 | Matsui et al. |
| 2006/0029358 | A1 | 2/2006 | Mahgerefteh et al. |
| 2006/0029396 | A1 | 2/2006 | Mahgerefteh et al. |
| 2006/0029397 | A1 | 2/2006 | Mahgerefteh et al. |
| 2006/0228120 | A9 | 10/2006 | McCallion et al. |
| 2006/0233556 | A1 | 10/2006 | Mahgerefteh et al. |
| 2006/0274993 | A1 | 12/2006 | Mahgerefteh et al. |

FOREIGN PATENT DOCUMENTS

| | | |
|---|---|---|
| GB | 2 107 147 | 4/1983 |
| WO | 9905804 | 2/1999 |
| WO | 0104999 | 1/2001 |
| WO | 03005512 | 7/2002 |

OTHER PUBLICATIONS

Binder, J. et al., 10 Gbit/s-Dispersion Optimized Transmission at 1.55 um Wavelength on Standard Single Mode Fiber, IEEE Photonics Technology Letters, Apr. 1994, 558-560, vol. 6, No. 4.

Corvini, P.J. et al., Computer Simulation of High-Bit-Rate Optical Fiber Transmission Using Single-Frequency Lasers, Journal of Lightwave Technology, Nov. 1987, 1591-1596, vol. LT-5, No. 11.

Hyryniewicz, J.V., et al., Higher Order Filter Response in Coupled MicroRing Resonators, IEEE Photonics Technology Letters, Mar. 2000, 320-322, vol. 12, No. 3.

Koch, T. L. et al., Nature of Wavelength Chirping in Directly Modulated Semiconductor Lasers, Electronics Letters, Dec. 6, 1984, 1038-1039, vol. 20, No. 25/26.

Kurtzke, C., et al., Impact of Residual Amplitude Modulation on the Performance of Dispersion-Supported and Dispersion-Mediated Nonlinearity-Enhanced Transmission, Electronics Letters, Jun. 9, 1994, 988, vol. 30, No. 12.

Lee, Chang-Hee et al., Transmission of Directly Modulated 2.5-Gb/s Signals Over 250-km of Nondispersion-Shifted Fiber by Using a Spectral Filtering Method, IEEE Photonics Technology Letters, Dec. 1996, 1725-1727, vol. 8, No. 12.

Li, Yuan P., et al., Chapter 8: Silicon Optical Bench Waveguide Technology, Optical Fiber Communications, 1997, 319-370, vol. 111B, Lucent Technologies, New York.

Little, Brent E., Advances in Microring Resonators, Integrated Photonics Research Conference 2003.

Mohrdiek, S. et al., 10-Gb/s Standard Fiber Transmission Using Directly Modulated 1.55-um Quantum-Well DFB Lasers, IEEE Photonics Technology Letters, Nov. 1995, 1357-1359, vol. 7, No. 11.

Morton, P.A. et al., "38.5km error free transmission at 10Gbit/s in standard fibre using a low chirp, spectrally filtered, directly modulated 1.55um DFB laser", Electronics Letters, Feb. 13, 1997, vol. 33(4).

Prokais, John G., Digital Communications, 2001, 202-207, Fourth Edition, McGraw Hill, New York.

Rasmussen, C.J., et al., Optimum Amplitude and Frequency-Modulation in an Optical Communication System Based on Dispersion Supported Transmission, Electronics Letters, Apr. 27, 1995, 746, vol. 31, No. 9.

Shalom, Hamutal et al., On the Various Time Constants of Wavelength Changes of a DFB Laser Under Direct Modulation, IEEE Journal of Quantum Electronics, Oct. 1998, pp. 1816-1822, vol. 34, No. 10.

Wedding, B., Analysis of fibre transfer function and determination of receiver frequency response for dispersion supported transmission, Electronics Letters, Jan. 6, 1994, 58-59, vol. 30, No. 1.

Wedding, B., et al., 10-Gb/s Optical Transmission up to 253 km Via Standard Single-Mode Fiber Using the Method of Dispersion-Supported Transmission, Journal of Lightwave Technology, Oct. 1994, 1720, vol. 12, No. 10.

Yu, et al., Optimization of the Frequency Response of a Semiconductor Optical Amplifier Wavelength Converter Using a Fiber Bragg Grating, Journal of Lightwave Technology, Feb. 1999, 308-315, vol. 17, No. 2.

\* cited by examiner

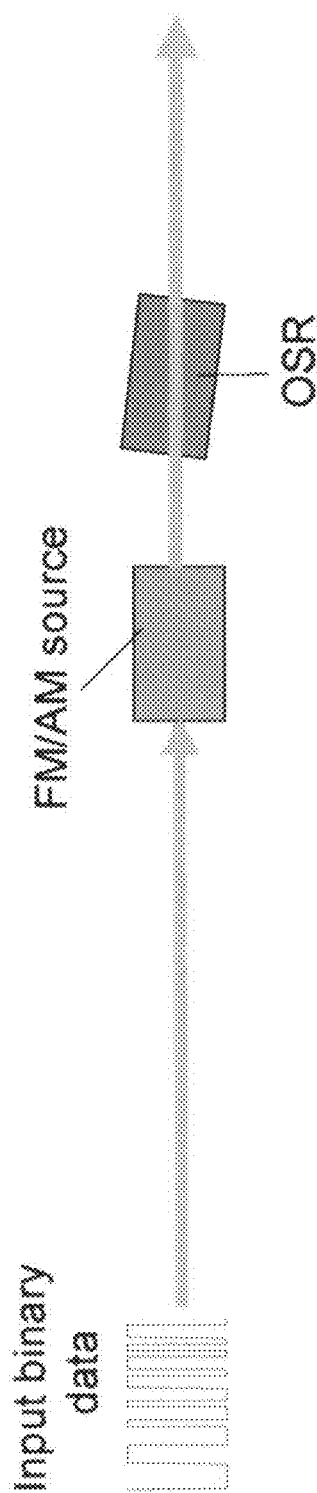
Fig. 1 Schematic of the Chirp Managed Laser

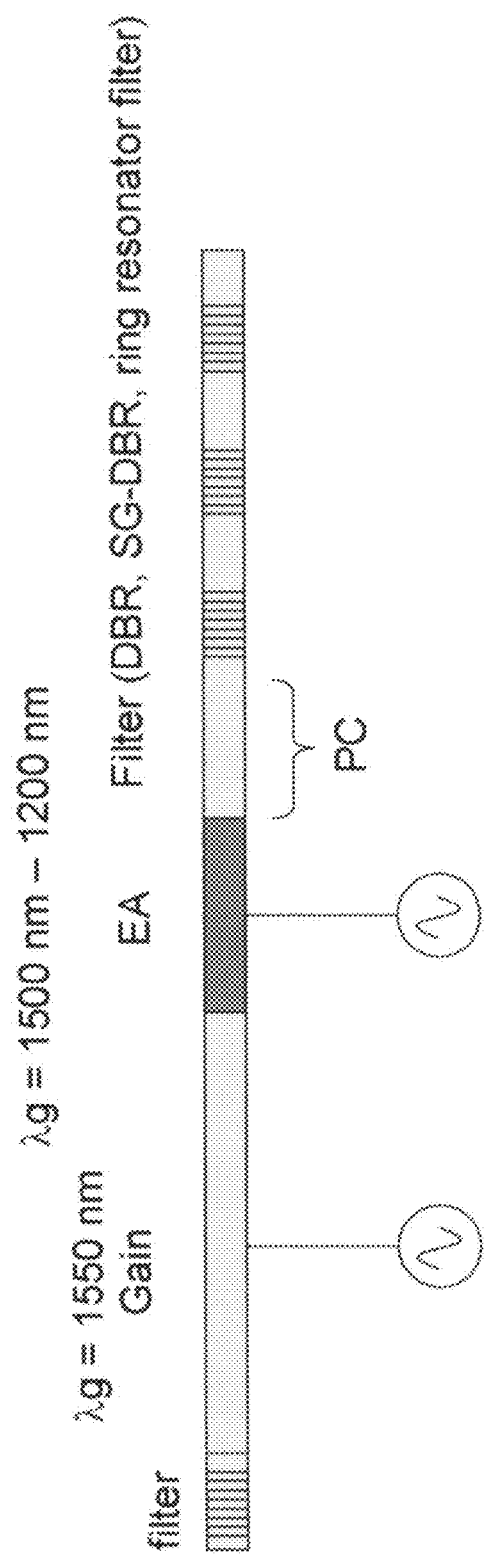
Fig. 2 DBR laser with directly modulated electro-absorption loss section in the cavity for efficient FM generation

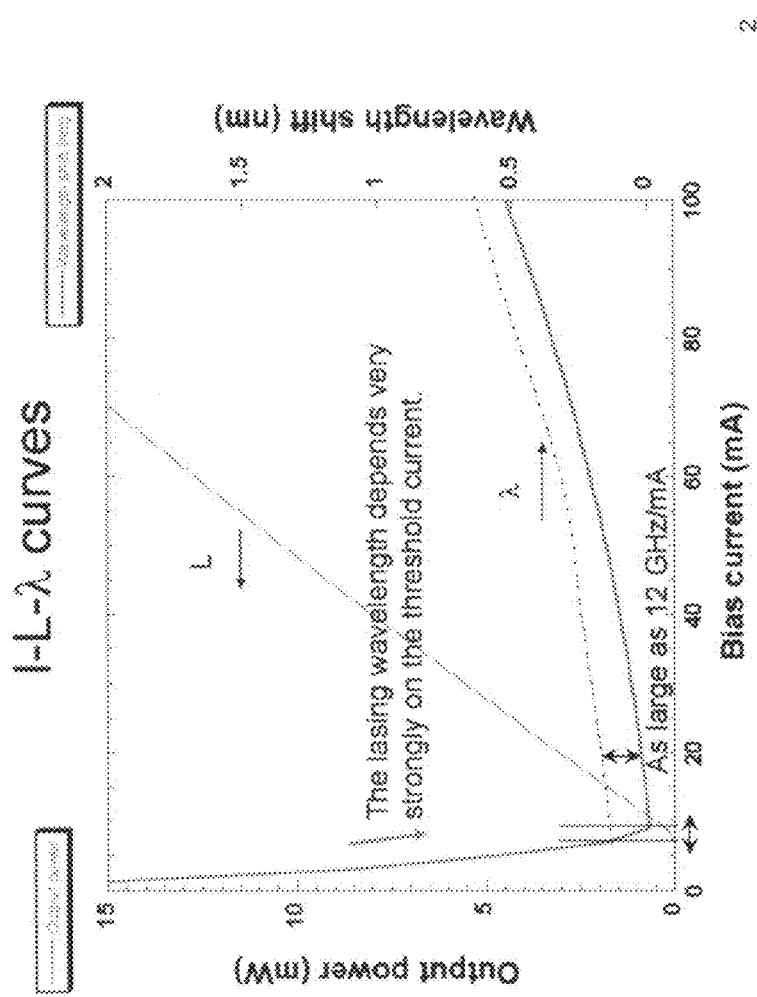
Fig. 3 Dependence of lasing wavelength on threshold current demonstrates efficiency of using loss modulation in laser for FM generation.

$$\frac{\partial N}{\partial t} = \frac{I_{bias}}{e \cdot vol} - \frac{g}{(1+\varepsilon S)} S - BN^2 \quad \text{--- carriers}$$

$$\frac{\partial S}{\partial t} = \Gamma \frac{g}{1+\varepsilon S} S - \frac{S}{\tau_p} \quad \text{--- photons}$$

$$\frac{\partial \phi}{\partial t} = \frac{1}{2} \Gamma \frac{dn}{dN}(N - N_{ref}) + PM \quad \text{--- phase}$$

Fig. 4 Rate equations for a laser including loss modulation by modulation of photon lifetime

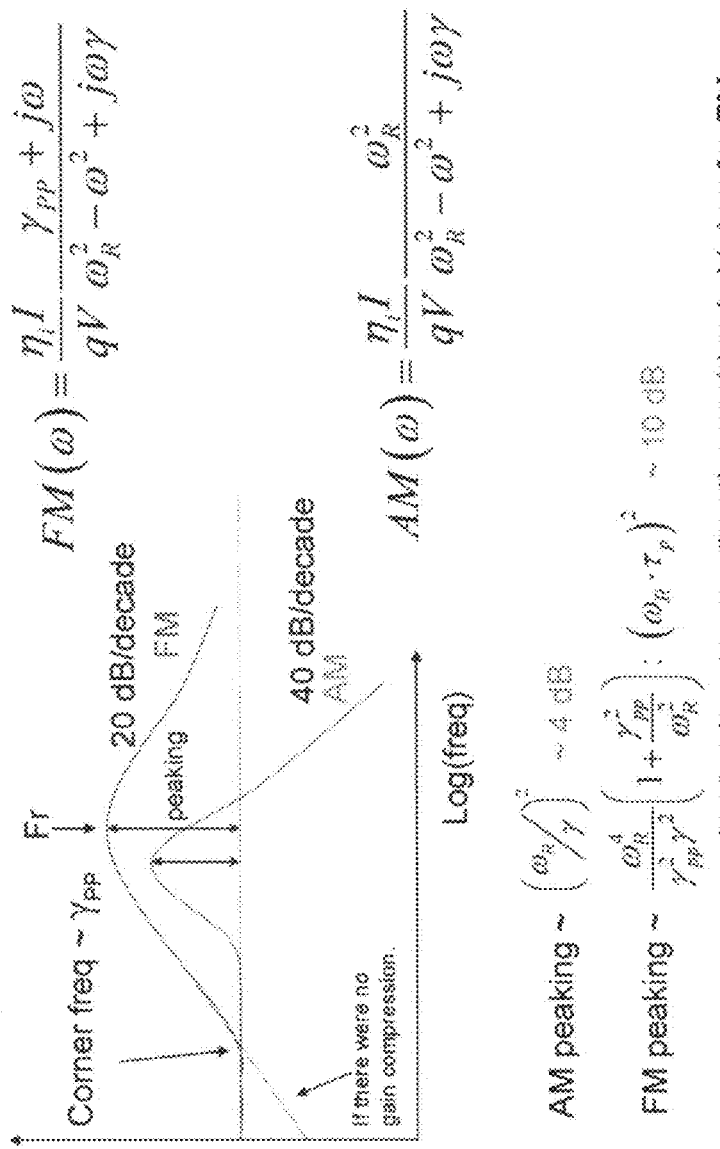
Fig. 5 AM and FM response for conventional gain modulation

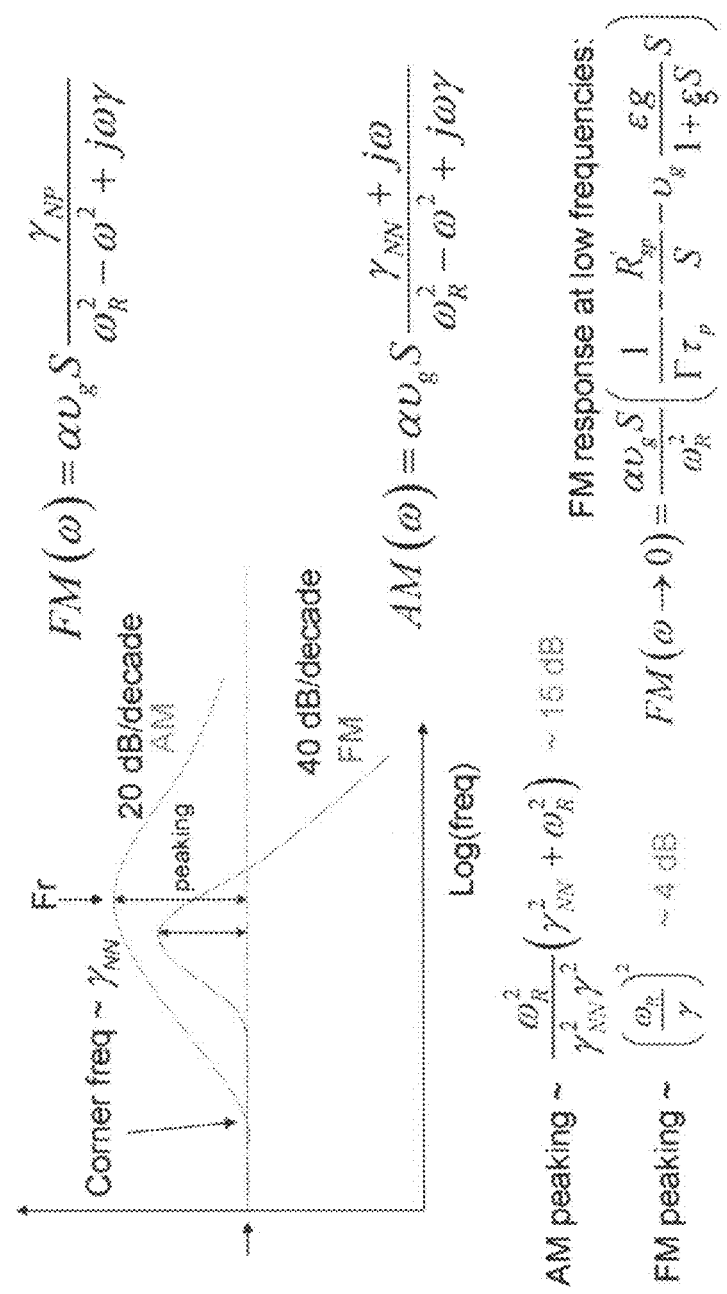
Fig. 6 AM and FM response for loss modulation

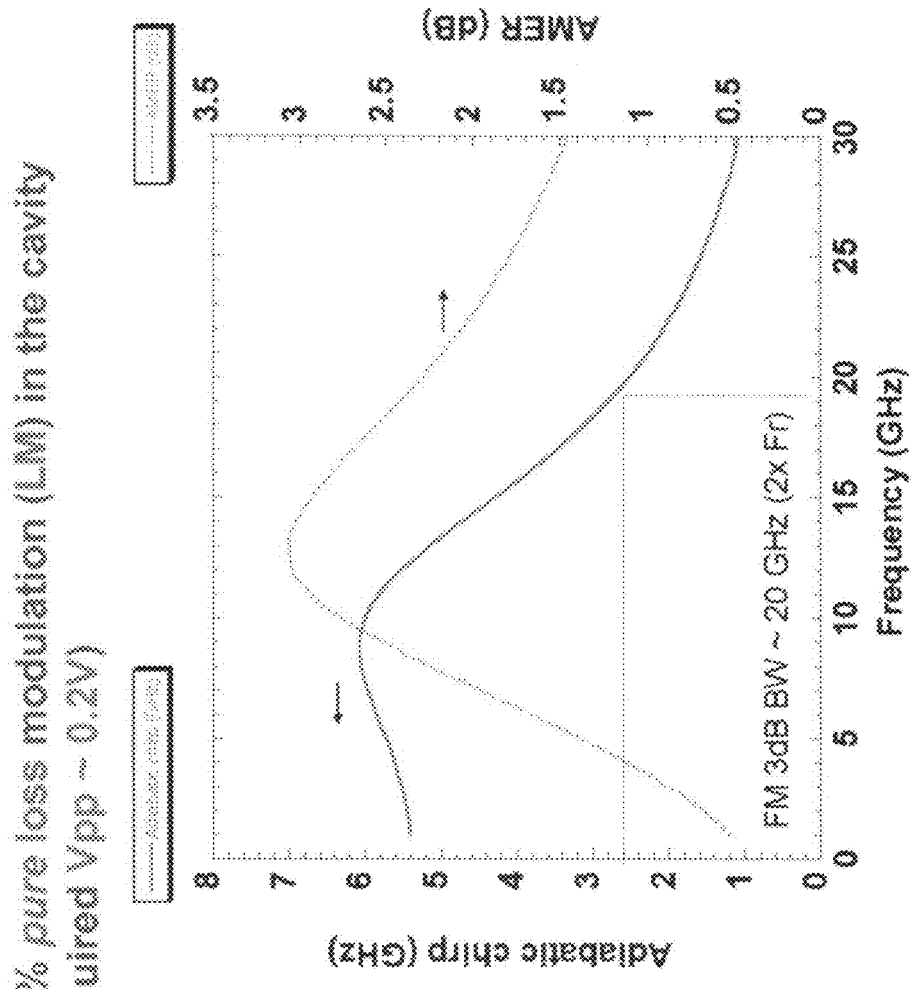
Fig. 7 AM and FM response for a +/-2% modulation of intra-cavity loss

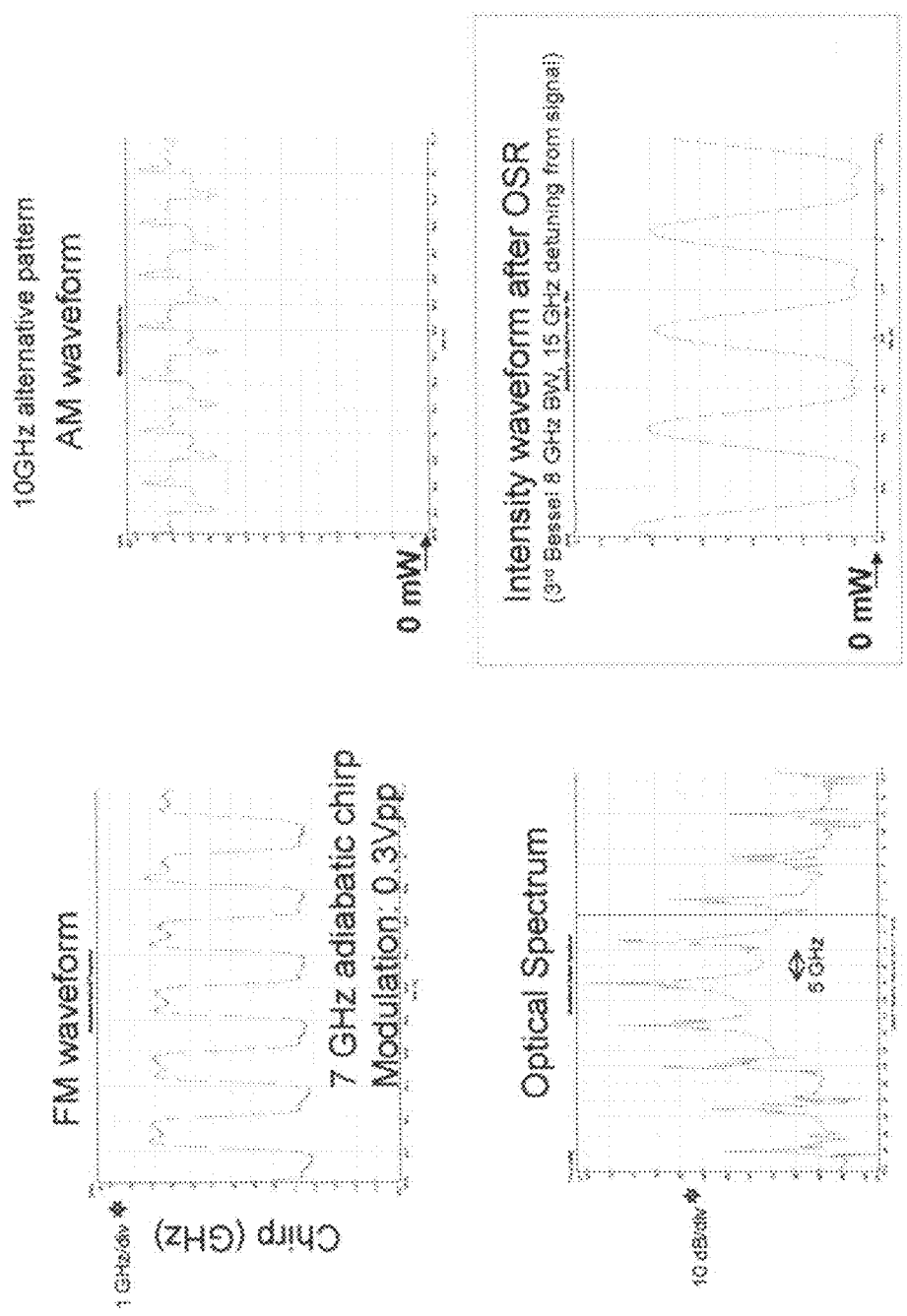
Fig. 8 AM and FM response as a function of time for loss modulation by a digital sequence of 1s and 0s.

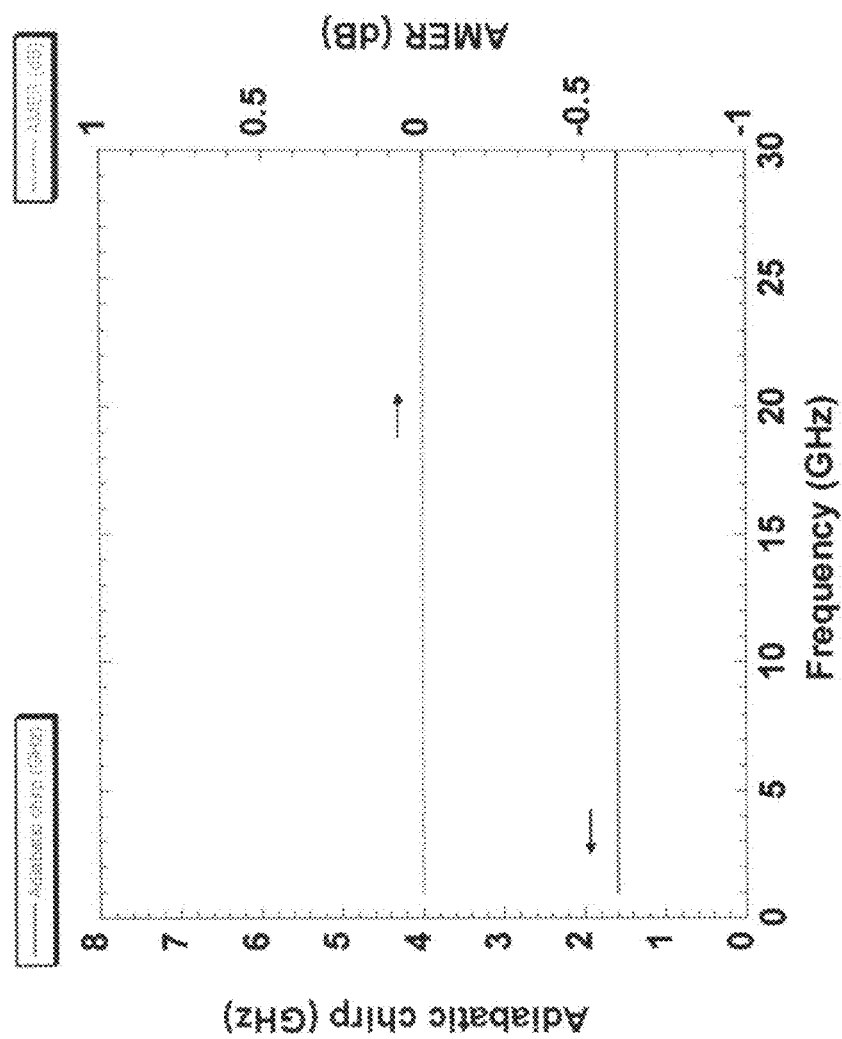
Fig. 9 AM and FM response for pure intra-cavity phase modulation.

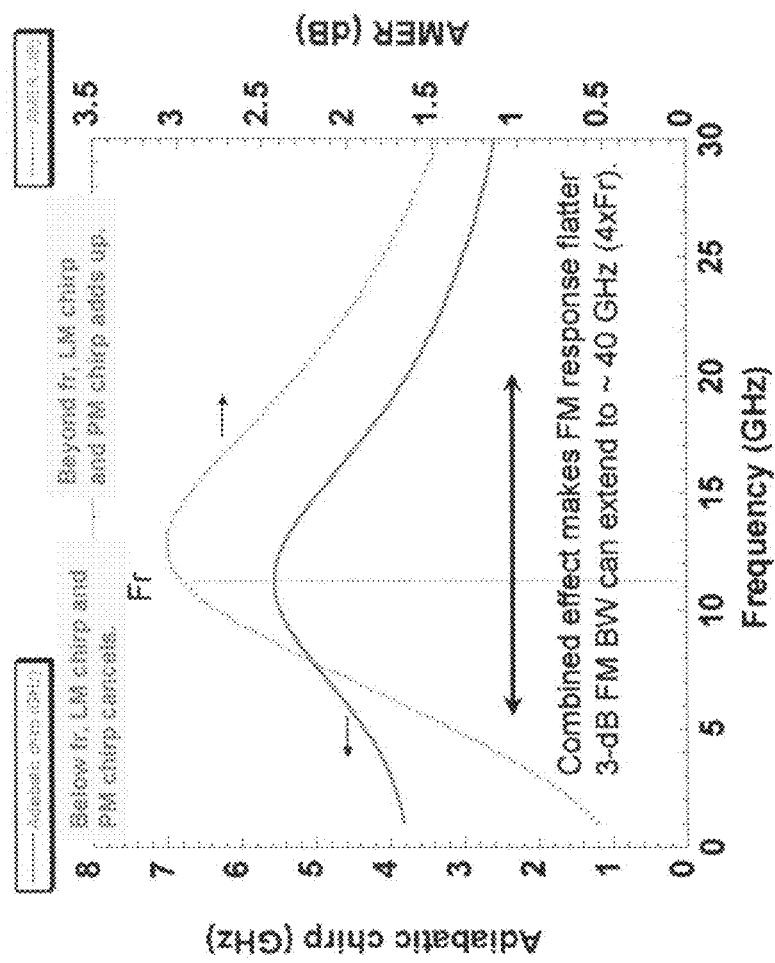
Fig. 10 AM and FM response for simultaneous intra-cavity loss and phase modulation

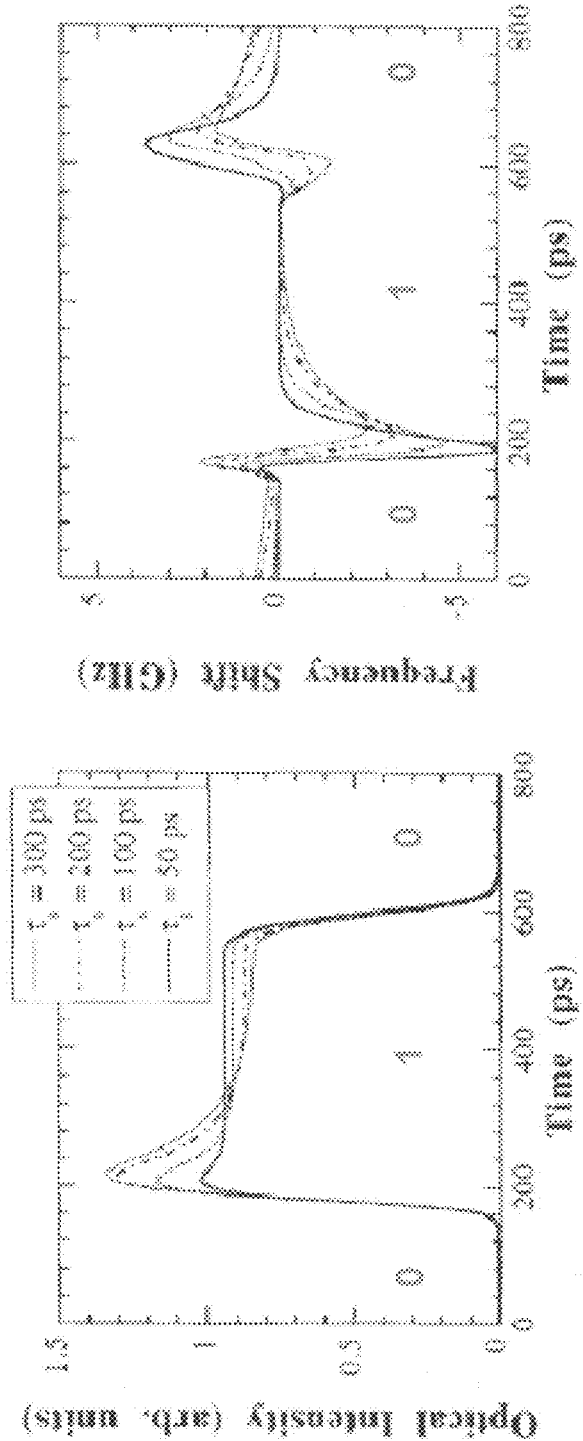

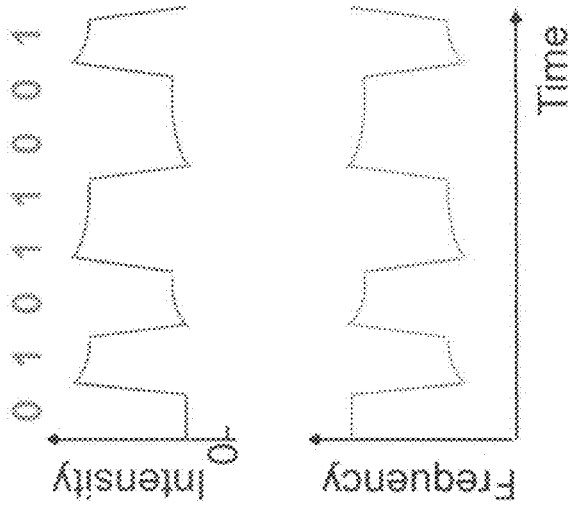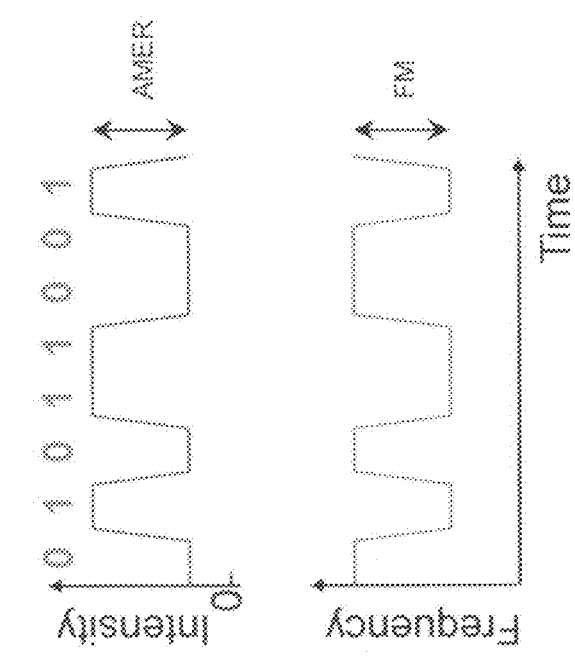
Fig. 13

Fig. 15a DML signal after SOA

Fig. 15b loss-modulated signal after SOA

Fig. 20

OPTICAL TRANSMISSION USING SEMICONDUCTOR OPTICAL AMPLIFIER (SOA)

REFERENCE TO PRIOR PATENT APPLICATIONS

This patent application:

(i) is a continuation-in-part of prior U.S. patent application Ser. No. 11/272,100, filed Nov. 8, 2005 now U.S. Pat. No. 7,477,851 by Daniel Mahgerefteh et al. for POWER SOURCE FOR A DISPERSION COMPENSATION FIBER OPTIC SYSTEM;

(ii) is a continuation-in-part of pending prior U.S. patent application Ser. No. 10/308,522, filed Dec. 3, 2002 by Daniel Mahgerefteh et al. for HIGH-SPEED TRANSMISSION SYSTEM COMPRISING A COUPLED MULTI-CAVITY OPTICAL DISCRIMINATOR;

(iii) is a continuation-in-part of prior U.S. patent application Ser. No. 11/441,944, filed May 26, 2006 now U.S. Pat. 7,492,876 by Daniel Mahgerefteh et al. for FLAT DISPERSION FREQUENCY DISCRIMINATOR (FDFD);

(iv) is a continuation-in-part of prior U.S. patent application Ser. No. 11/037,718, filed Jan. 18, 2005 now U.S. Pat. 7,536,113 by Yasuhiro Matsui et al. for CHIRP MANAGED DIECTLY MODULATED LASER WITH BANDWITH LIMITING OPTICAL SPECTRUM RESHAPER;

(v) is a continuation-in-part of prior U.S. patent application Ser. No. 11/068,032, filed Feb. 28, 2005 now U.S. Pat. 7,555,225 by Daniel Mahgerefteh et al. for OPTICAL SYSTEM COMPRISING AN FM SOURCE AND A SPECTRAL RESHAPING ELEMENT;

(vi) is a continuation-in-part of prior U.S. patent application Ser. No. 11/084,630, filed Mar. 18, 2005 now U.S. Pat. 7,406,266 by Daniel Mahgerefteh et al. for FLAT-TOPPED CHIRP INDUCED BY OPTICAL FILTER EDGE;

(vii) is a continuation-in-part of pending prior U.S. patent application Ser. No. 11/787,163, filed Apr. 13, 2007 by Yasuhiro Matsui et al. for OPTICAL FM SOURCE BASED ON INTRA-CAVITY PHASE AND AMPLITUDE MODULATION IN LASERS; and (viii) claims benefit of pending prior U.S. Provisional Patent Application Ser. No. 60/838,548 filed Aug. 18, 2006 by Yasuhiro Matsui et al. for SEMICONDUCTOR OPTICAL AMPLIFIER BASED OPTICAL TRANSMISSION.

The eight (8) above-identified patent applications are hereby incorporated herein by reference.

FIELD OF THE INVENTION

This invention generally relates to semiconductor laser diodes used in optical fiber communication systems, and more particularly to the frequency modulation of such laser diodes for coding data being transmitted within such fiber optic communication systems, including chirp-managed directly modulated lasers.

BACKGROUND OF THE INVENTION

Optical communication systems based on frequency shift keying require lasers that can generate optical frequency modulation (FM) with high efficiency and a flat response from low frequencies up to the frequency comparable to the bit rate of the transmission systems, e.g., 1 MHz to 10 GHz for a 10 Gb/s digital signal.

Direct gain modulation of a semiconductor laser is a known, simple scheme to generate FM. It generally comprises the steps of biasing the laser with a DC bias so as to provide gain to the laser, and modulating this injected current about the DC bias so as to generate the desired FM. However, this method of FM generation is very inefficient. More particularly, a measure of FM efficiency is the ratio of the peak-peak frequency modulation (also sometimes referred to as adiabatic chirp) generated to the applied modulation current or the applied modulation voltage (as the case may be). For example, for a directly modulated laser in which the laser impedance is matched to 50 Ohms, the FM efficiency is typically about 3 GHz/V. Direct gain modulation generates frequency modulation (adiabatic chirp) through the physical mechanism sometimes called gain compression, spatial hole burning, and linewidth enhancement, which generates an index change for any associated gain change in the material. All of these processes are known in the art. Furthermore, FM modulation by gain modulation through current injection leads to the heating of laser cavity, which in turn causes the lasing frequency to red shift to lower frequencies on a slow time scale. This effect is sometimes called thermal chirp and typically has a frequency response of <20 MHz associated with the thermal diffusion and dissipation time constants. Thermal chirp, which is red shifted for an increase in drive signal, counteracts the desired adiabatic chirp, which generates a blue shift for the same signal. Thermal chirp can generate pattern dependence and can increase the bit error rate (BER) of a digital transmission system such as a chirp managed laser (CML) transmitter.

The quality and performance of a digital fiber optic transmitter is determined by the distance over which the transmitted digital signal can propagate without severe distortions. The bit error rate (BER) of the signal is measured at a receiver after propagation through dispersive fiber, and the optical power required to obtain a certain BER (typically $10^{-12}$), which is sometimes called the sensitivity, is determined. The difference in sensitivity at the output of the transmitter vis-á-vis the sensitivity after propagation is sometimes called the dispersion penalty. This is typically characterized by the distance over which a dispersion penalty reaches a level of ~1 dB. A standard 10 Gb/s optical digital transmitter, such as an externally modulated source, can transmit up to a distance of ~50 km in standard single mode fiber at 1550 nm before the dispersion penalty reaches a level of ~1 dB, which is sometimes called the dispersion limit. The dispersion limit is determined by the fundamental assumption that the digital signal is transform-limited, i.e., the signal has no time-varying phase across its bits and has a bit period of 100 ps, or 1/(bit rate), for the standard 10 Gb/s transmission. Another measure of the quality of a transmitter is the absolute sensitivity after fiber propagation.

Three types of optical transmitters are presently in use in prior art fiber optic systems: (i) directly modulated lasers (DML); (ii) Electroabsorption Modulated Lasers (EML); and (iii) Externally Modulated Mach Zhender modulators (MZ). For transmission in standard single mode fiber at 10 Gb/s, and 1550 nm, it has generally been assumed that MZ modulators and EMLs can have the longest reach, typically reaching approximately 80 km. Using a special coding scheme, sometimes referred to as the phase-shaped duobinary approach, MZ transmitters can reach approximately 200 km. On the other hand, directly modulated lasers (DML) typically reach <5 km because their inherent time-dependent chirp causes severe distortion of the signal after this distance.

Recently, various systems have been developed which provide long-reach lightwave data transmission (e.g., >80 km at 10 Gb/s) using DMLs. By way of example but not limitation, systems which increase the reach of DMLs to >80 km at 10

Gb/s in single mode fiber are disclosed in (i) U.S. patent application Ser. No. 11/272,100, filed Nov. 8, 2005 by Daniel Mahgerefteh et al. for POWER SOURCE FOR A DISPERSION COMPENSATION FIBER OPTIC SYSTEM; (ii) U.S. patent application Ser. No. 11/441,944, filed May 26, 2006 by Daniel Mahgerefteh et al. for FLAT DISPERSION FREQUENCY DISCRIMINATOR (FDFD); and (iii) U.S. patent application Ser. No. 10/308,522, filed Dec. 3, 2002 by Daniel Mahgerefteh et al. for HIGH-SPEED TRANSMISSION SYSTEM COMPRISING A COUPLED MULTI-CAVITY OPTICAL DISCRIMINATOR; which patent applications are hereby incorporated herein by reference. The transmitters associated with these novel systems are sometimes referred to as Chirp Managed Laser (CML)™ transmitters by Azna LLC of Wilmington, Mass. In these new CML systems, a Frequency Modulated (FM) source is followed by an Optical Spectrum Reshaper (OSR) which uses the frequency modulation to increase the amplitude modulated signal and partially compensate for dispersion in the transmission fiber. See FIG. 1, which shows a CML transmitter. In some preferred embodiments of these CML transmitters, the frequency modulated source may comprise a Directly Modulated Laser (DML). The Optical Spectrum Reshaper (OSR), sometimes referred to as a frequency discriminator, can be formed by an appropriate optical element that has a wavelength-dependent transmission function, e.g., a filter. The OSR can be adapted to convert frequency modulation to amplitude modulation.

The present invention is intended to enhance the performance of the aforementioned CML systems, among other things.

SUMMARY OF THE INVENTION

The present invention provides an optical frequency modulated (FM) source based on intra-cavity phase and amplitude modulation in lasers. And in one form of the present invention, this FM source may be used in a CML transmitter. More particularly, in one preferred form of the present invention, there is provided (i) a chirp managed laser (CML) comprising an FM source, and (ii) an optical spectrum reshaper (OSR) filter, wherein the desired FM is generated using intra-cavity loss modulation of the laser cavity. This approach for FM generation can be applied to a variety of laser designs, and a variety of methods can be used to modulate the loss of the cavity. In one preferred embodiment of the present invention, the laser is a distributed Bragg reflector (DBR) laser, and the loss of the laser cavity is directly modulated by an electro-absorption (EA) modulator, which is integrated in the laser cavity. Modulation of the cavity loss causes the carrier density in the gain section to change significantly, thereby generating large adiabatic chirp. This approach is highly advantageous, since it substantially reduces or eliminates thermal chirp within the laser, thereby increasing the FM efficiency of the system. This can provide a substantial improvement to the aforementioned CML systems.

In one form of the present invention, there is provided a fiber optic communication system comprising:

an optical signal source adapted to receive a binary base signal having a bit period T, and generate a first signal, wherein the first signal is frequency modulated; and an optical spectrum reshaper (OSR) adapted to reshape the first signal into a second signal, wherein the second signal is amplitude modulated and frequency modulated;

characterized in that:

the optical signal source is a laser in which frequency modulation is generated by modulating the loss of the laser cavity.

In another form of the present invention, there is provided a method for transmitting a signal, comprising:

receiving a binary base signal having a bit period T, and generating a first signal, wherein the first signal is frequency modulated; and reshaping the first signal into a second signal, wherein the second signal is amplitude modulated and frequency modulated;

characterized in that:

the first signal is frequency modulated by using a laser in which frequency modulation is generated by modulating the loss of the laser cavity.

In another form of the present invention, there is provided a fiber optic communication system comprising:

an optical signal source adapted to receive a binary base signal having a bit period T, and generate a first signal, wherein the first signal is frequency modulated; and an optical spectrum reshaper (OSR) adapted to reshape the first signal into a second signal, wherein the second signal is amplitude modulated and frequency modulated;

characterized in that:

the optical signal source is a laser in which frequency modulation is generated by modulating the phase of the laser cavity.

In a preferred form of the present invention, there is provided a fiber optic communication system comprising:

an optical signal source adapted to receive a binary first signal and generate a binary second signal, wherein the binary first signal has an amplitude modulated component, wherein the binary second signal has an amplitude modulated component and a frequency modulated component, and further wherein the binary second signal is characterized in that the higher intensity 1 bits are red shifted relative to the lower intensity 0 bits;

a semiconductor optical amplifier (SOA) adapted to receive the binary second signal and generate a binary third signal, wherein the binary third signal has an amplitude modulated component and a frequency modulated component, and further wherein the semiconductor optical amplifier operates in saturation; and an optical spectrum reshaper (OSR) adapted to reshape the binary third signal into a binary fourth signal, wherein the binary fourth signal has an amplitude modulated component and a frequency modulated component.

In a further preferred form of the present invention, there is provided a method for transmitting a signal, comprising:

receiving a binary first signal having an amplitude modulated component and generating a binary second signal having an amplitude modulated component and a frequency modulated component, wherein the binary second signal is characterized in that the higher intensity 1 bits are red shifted relative to the lower intensity 0 bits;

passing the binary second signal through a semiconductor optical amplifier (SOA) operating in saturation so as to generate a binary third signal, wherein the binary third signal has an amplitude modulated component and a frequency modulated component; and reshaping the binary third signal into a binary fourth signal, wherein the binary fourth signal has an amplitude modulated component and a frequency modulated component.

BRIEF DESCRIPTION OF THE DRAWINGS

These and other objects, features and advantages of the present invention will be more fully disclosed or rendered obvious by the following detailed description of the preferred embodiments of the invention, which is to be considered together with the accompanying drawings wherein like numbers refer to like parts and further wherein:

FIG. 1 is a schematic diagram showing a chirp managed laser transmitter;

FIG. 2 is a schematic diagram showing a DBR laser having a directly modulated electro-absorption loss section in the cavity for efficient FM generation;

FIG. 3 shows the dependence of the lasing wavelength on threshold current and demonstrates the efficiency of using loss modulation in the laser for FM generation;

FIG. 4 shows rate equations for a laser, including loss modulation by modulation of photon lifetime;

FIG. 5 illustrates AM and FM response for conventional gain modulation;

FIG. 6 illustrates AM and FM response for loss modulation;

FIG. 7 illustrates AM and FM response for a +/−2% modulation of intra-cavity loss;

FIG. 8 illustrates AM and FM response as a function of time for loss modulation by a digital sequence of 1s and 0s;

FIG. 9 illustrates AM and FM response for pure intra-cavity phase modulation;

FIG. 10 illustrates AM and FM response for simultaneous intra-cavity loss and phase modulation;

FIG. 11 shows the intensity distortion and chirp distortion for a 010 signal after that signal passes through a semiconductor optical amplifier (SOA);

FIG. 13 shows a simple AM-FM signal where high intensity correlates with low frequency, and shows how an SOA acts as a high-pass filter for both the AM and FM components of the signal;

FIG. 20 shows the signal on the short wavelength side of the OSR filter;

DETAILED DESCRIPTION OF THE PREFERRED EMBODIMENTS

Figure 12:
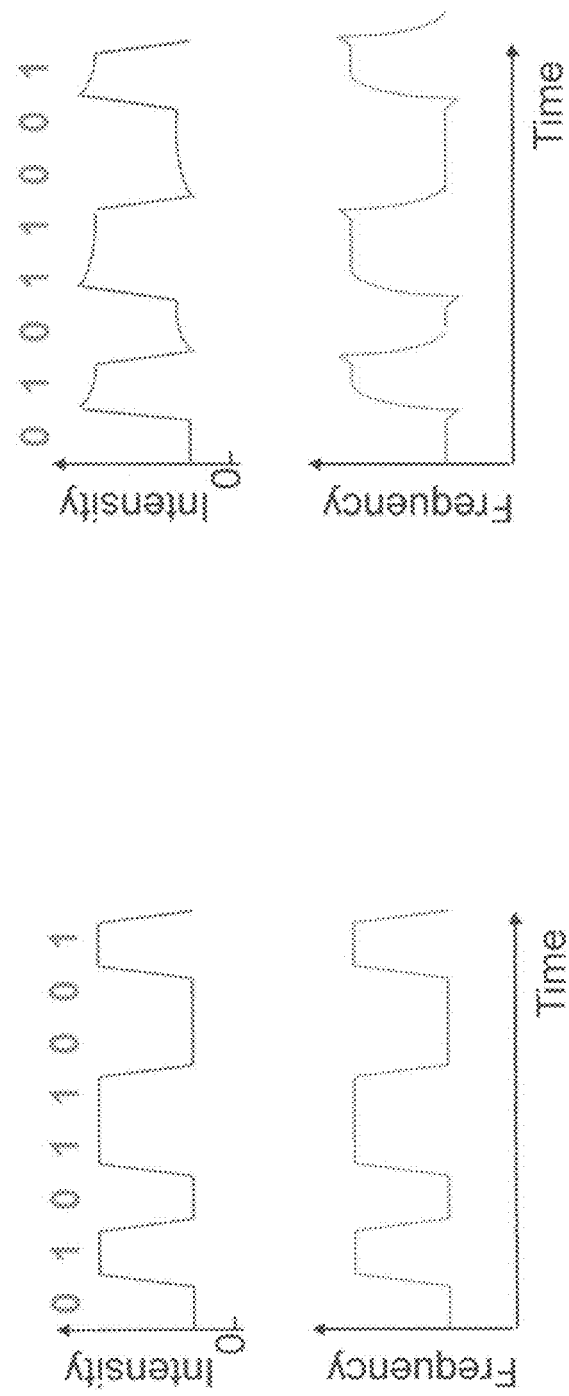
FIG. 12 shows a simple AM-FM signal where high intensity correlates with high frequency, and shows how an SOA acts as a high-pass filter for the AM component of the signal and the SOA acts as a low-pass filter for the FM component of the signal.

Intra-Cavity Loss Modulation and/or Intra-Cavity Phase Modulation to Improve Signal Transmission FIG. 2 shows one preferred embodiment of the present invention, wherein an electro-absorption (EA) modulator is integrated inside a distributed Bragg reflector (DBR) laser cavity. The EA section is reverse biased. Application of a reverse bias voltage to the EA increases cavity loss, which increases the threshold gain for lasing. This increases the threshold carrier density, which causes the laser frequency to shift towards the blue, i.e., so as to provide frequency modulation.

The large FM efficiency by loss modulation can be understood by considering FIG. 3, which shows the lasing wavelength as a function of injection current into a constant wave (CW) laser. It is known that the lasing wavelength of a CW semiconductor laser depends on the threshold current. Wavelength shifts to the blue as more carriers are injected into the laser below threshold. For example, the wavelength of the laser shifts by 0.2 nm (24 GHz) when the threshold current increases from 7 mA to 9 mA. This corresponds to a frequency shift efficiency of 12 GHz/mA, and indicates that intra-cavity loss modulation can be a very efficient way to generate FM in a laser.

A modification of the "standard rate equations model" for a semiconductor laser can demonstrate how loss modulation generates FM in the case of high speed modulation. FIG. 4 shows the set of rate equations for photons, carriers and phase, in which loss modulation is included by modulating the photon lifetime in the rate equation. Modulation of photon lifetime can be achieved by modulating the mirror loss of the cavity. Modulation of photon lifetime is one of several methods for modulating the intra-cavity loss of a laser to generate the desired FM modulation. Other methods are also available, e.g., mirror loss modulation, intra-cavity loss modulation using a saturable absorber, etc. Thus, photon lifetime modulation is used here in the rate equations in order to illustrate the result of loss modulation on the AM and FM response of a laser, but is not intended to indicate that only one such method is available.

In order to elucidate the difference between conventional gain modulation and the loss modulation approach of the present invention, we can compare the small signal frequency response solutions of the rate equations for the two cases (i.e., conventional gain modulation and the loss modulation approach of the present invention). FIG. 5 describes the small signal frequency response to the rate equations for conventional high speed gain modulation of laser diodes, which produces amplitude modulation (AM) and frequency modulation (FM). As is known in the art, the AM response shows a peak at slightly lower frequency than a characteristic relaxation oscillation frequency, $f_r$, with a peak height of ~4 dB. The response rolls off beyond $f_r$ at a rate of 40 dB/decade. The FM response shows the peaking exactly at $f_r$, with a peak response of ~10 dB. The response rolls off beyond $f_r$ at a rate of 20 dB/decade. Therefore, with conventional current modulation of a laser diode, FM has a higher effective bandwidth.

In contrast, FIG. 6 shows the AM and FM response for intra-cavity loss modulation of a laser diode. In this case, the frequency response of AM and FM show reversed trends compared to that for conventional gain modulation. The AM response shows peaking at $f_r$, with a peak height of ~15 dB, and rolls off beyond $f_r$ at a rate of 20 dB/decade. The FM response shows a peak at a slightly lower frequency than $f_r$, with a peak response of ~4 dB. The response rolls off beyond $f_r$ at a rate of 40 dB/decade. Therefore, an enhancement in AM modulation bandwidth is expected for the intra-cavity loss modulation scheme, while FM modulation bandwidth will be lower than that for current modulation.

In another embodiment of the present invention, the FM response is enhanced by the addition of intra-cavity phase modulation.

FIG. 7 shows the AM and FM response for +/−2% modulation in the intra-cavity loss. The corresponding modulation voltage for a typical EA modulator is ~0.2 Vpp. As the small signal analysis of the rate equation shows, the FM response shows relatively flat response up to the characteristic frequency $f_r$. The FM efficiency is as large as 5 GHz for the small modulation of ~0.2 Vpp to the EA modulator section. The AM response shows the large peaking around $f_r$.

In one preferred embodiment of the present invention, the loss modulated FM source is used as the source in a chirp managed laser (CML), together with an optical spectrum reshaper (OSR) filter, as described in (i) U.S. patent application Ser. No. 11/037,718, filed Jan. 18, 2005 by Yasuhiro Matsui et al. for CHIRP MANAGED DIECTLY MODULATED LASER WITH BANDWITH LIMITING OPTICAL SPECTRUM RESHAPER; (ii) U.S. patent application Ser. No. 11/068,032, filed Feb. 28, 2005 by Daniel Mahgerefteh et al. for OPTICAL SYSTEM COMPRISING AN FM SOURCE AND A SPECTRAL RESHAPING ELEMENT; and (iii) U.S. patent application Ser. No. 11/084,630, filed Mar. 18, 2005 by Daniel Mahgerefteh et al. for FLAT-TOPPED CHIRP INDUCED BY OPTICAL FILTER EDGE; which patent applications are hereby incorporated herein by reference.

FIG. 8 shows an example of modulation by a digital sequence, in which both AM and FM responses of a loss modulated laser are shown. FIG. 8 also shows the optical spectrum as well as the amplitude waveform after the signal has passed through an optical spectrum reshaper (OSR) filter, as prescribed in the chirp managed laser (CML) patent documents identified above. Among other things, the FM-to-AM conversion by the OSR filter increases the amplitude extinction ratio of the resulting signal.

In another embodiment of the present invention, and looking now at FIG. 9, only the phase is modulated inside the cavity. In this case, there is no AM modulation since gain is not affected, and the FM response can intrinsically be flat and only limited by the RC roll-off of the modulated section. As is evident in the rate equations, the phase of FM changes from 0 to π/2 as the modulation frequency is swept from DC beyond $f_r$. Since there is no timing delay between the modulation signal and the FM response generated by pure phase modulation in the cavity, the relative delay between loss-modulation induced FM and that induced by pure phase modulation changes with modulation frequency. At low frequency, both are π out of phase, since the sign of FM by loss modulation and phase modulation are opposite, assuming that the QCSE (or Franz-Keldysh) effect is used to generate phase modulation.

FIG. 10 shows the case where both intra-cavity loss and phase modulation (which can be induced, for example, by reverse bias modulation in an EA section) are present. At low frequencies, the FM response drops as a result of competition between loss modulation and phase modulation in the EA section. At frequencies higher than $f_r$, the two effects add up so as to improve the FM response. It is, therefore, possible to design the FM response with a reasonably flat response up to approximately 40 GHz.

A variety of mechanisms can be used to induce modulation of loss in the cavity of a laser. These include, but are not limited to, (i) the quantum confined stark effect (QCSE); (ii) the Pockels effect; and (iii) the Franz-Keldysh effect. These are all different manifestations of a change in the absorption or index characteristics of a semiconductor material by the application of a voltage to the material, and are known in the art.

Intra-cavity loss modulation can be applied to a variety of monolithic laser designs. By way of example but not limitation, these include (i) distributed feedback (DFB) lasers; (ii) distributed Bragg reflector (DBR) lasers; (iii) sampled grating distributed Bragg reflector (SG-DBR) lasers; and (iv) Y branch DBR lasers. In each case, a new loss section of the laser needs to be added (e.g., an EA section or a saturable absorber section) in order to induce loss in the cavity. Alternatively, the mirror loss can be modulated in each case.

Other lasers can also be loss modulated so as to generate the desired FM. These include, but are not limited to, (i) external cavity lasers such as external cavity lasers with fiber Bragg gratings, ring resonators, planar lightwave circuit (PLC) Bragg gratings, arrayed waveguide gratings (AWG), and grating filters as external cavities; (ii) vertical cavity surface emitting lasers (VCSEL); and (iii) Fabry Perot lasers. All of the foregoing lasers, as well as other lasers, can also be loss modulated so as to generate the desired FM.

Optical Transmission Using Semiconductor Optical Amplifier (SOA)

Semiconductor optical amplifiers (SOA) are widely used for amplification of optical digital signals in optical transmission systems. It is well known that SOAs cause distortion (in the form of both intensity and chirp) to the incoming signal where the intensity for 1's and 0's are modulated digitally (see FIG. 11). This distortion becomes significant for higher input powers (i.e., higher intensity signals) input into the SOA, due to stronger depletion of carriers in the SOA during the on-state of the signal followed by recovery of carriers to an unsaturated level during the off-state of the signal, with a finite time constant defined as a gain recovery time. The depletion of carriers in the SOA causes a change in refractive index through the plasma effect. This in turn causes a change in the instantaneous frequency of the signal, which is obtained as the time derivative of the refractive index change or the phase. This leads to frequency down-chirp in the leading edge of the signal and frequency up-chirp on the trailing edge of the signal (FIG. 11b). This is the origin of the transient chirp observed when an intensity-modulated digital signal passes through an SOA. FIG. 11 shows that the distortion in the intensity of the signal caused by a saturated SOA can be described as a "high-pass filter effect" for the AM signal, since the leading edge of the input pulse undergoes an overshooting in the intensity waveform after the SOA. This is because high frequency components experience unsaturated gain, while low frequency components experience the smaller saturated gain.

FIG. 12 shows SOA signal distortion for the case where frequency modulation coexists with the intensity modulation, e.g., where a CML signal is passed through an SOA. In this case, the high intensity bit in the AM component of the signal corresponds to high frequency in the FM component of the signal; i.e. the digital 1 bits with higher intensity are blue shifted relative to lower intensity 0 bits. As this signal passes through the SOA, the leading edges produce transient chirp whose frequency excursion is negative (i.e., frequency down-chirp). This frequency excursion has a sign which is opposite to the sign of the adiabatic chirp of the incoming signal, and therefore increases the rise time of the FM signal in the leading edges and the fall time in the trailing edges. In other words, the SOA acts as a low-pass filter for the FM component of the signal and limits the bandwidth of the incoming signal, which is not suitable for high bit rate transmissions. Thus, it is generally not possible to use an SOA in saturation with signals having both frequency modulation and intensity modulation, e.g., it is generally not possible to use a saturated SOA with a CML signal.

FIG. 13 also shows SOA distortion for the case where frequency modulation coexists with the intensity modulation, but where the chirp has opposite sign to that of previous example shown in FIG. 12. In this case shown in FIG. 13, the high intensity bit in the AM component corresponds with low frequency in the FM component; i.e. the high intensity 1 bits are red shifted relative to the lower intensity 0 bits, which are blue shifted. Here, with passage through the SOA, the leading edges of the signal produce a transient chirp whose frequency excursion is negative (i.e., frequency down-chirp). This SOA-induced chirp in this case has the same sign as the adiabatic chirp of the incoming signal, and therefore reduces the rise time of the FM component of the signal in the leading edges and the fall time in the trailing edges of the signal. In other words, the SOA acts as a high-pass filter for the FM component and expands the bandwidth of the incoming signal, which can improve the performance of high bit rate transmissions.

In this respect, it should be noted that in CML applications, the OSR limits the bandwidth and therefore tends to reduce the eye opening, as measured for example with a standard eye mask margin, by increasing the rise and fall times of the signal (i.e., the OSR removes transient chirp components from the chirped waveform). Significantly, it has now been discovered that the high-pass effect provided by the SOA can be used favorably to counteract with the bandwidth limiting effect of the OSR.

In practice, the relative magnitudes of the adiabatic chirp in the original FM component of the input signal and the transient chirp created by the SOA should be adjusted within the right proportion so as to provide maximum bandwidth. This will be discussed in the following discussion, which includes experimental results.

Figure 14:
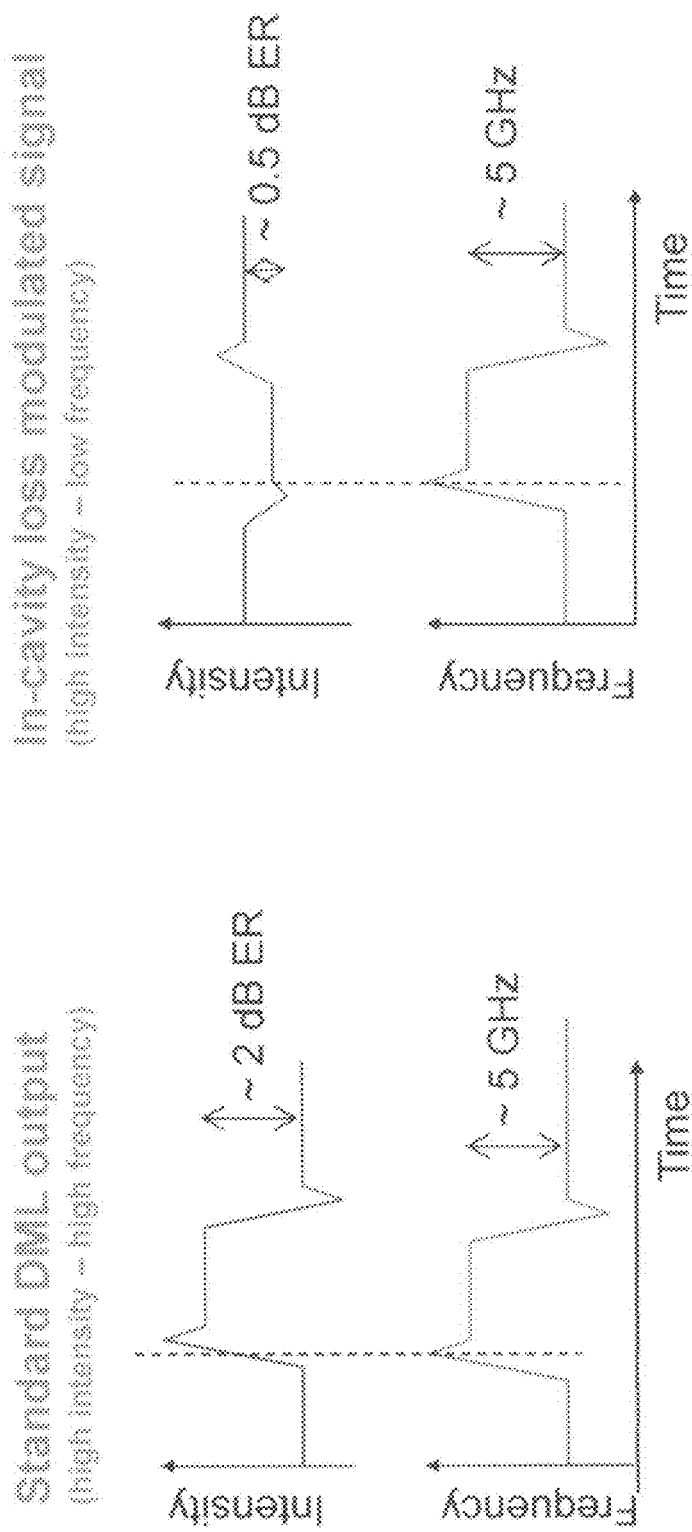
FIG. 14 shows a standard DML signal with transient chirp, where the AM modulation and the FM modulation have the same sign (i.e., high intensity corresponds with high frequency), and an in-cavity loss modulated signal with transient chirp, where the AM modulation and the FM modulation have the opposite sign (i.e., high intensity corresponds with low frequency)
Figure 15:
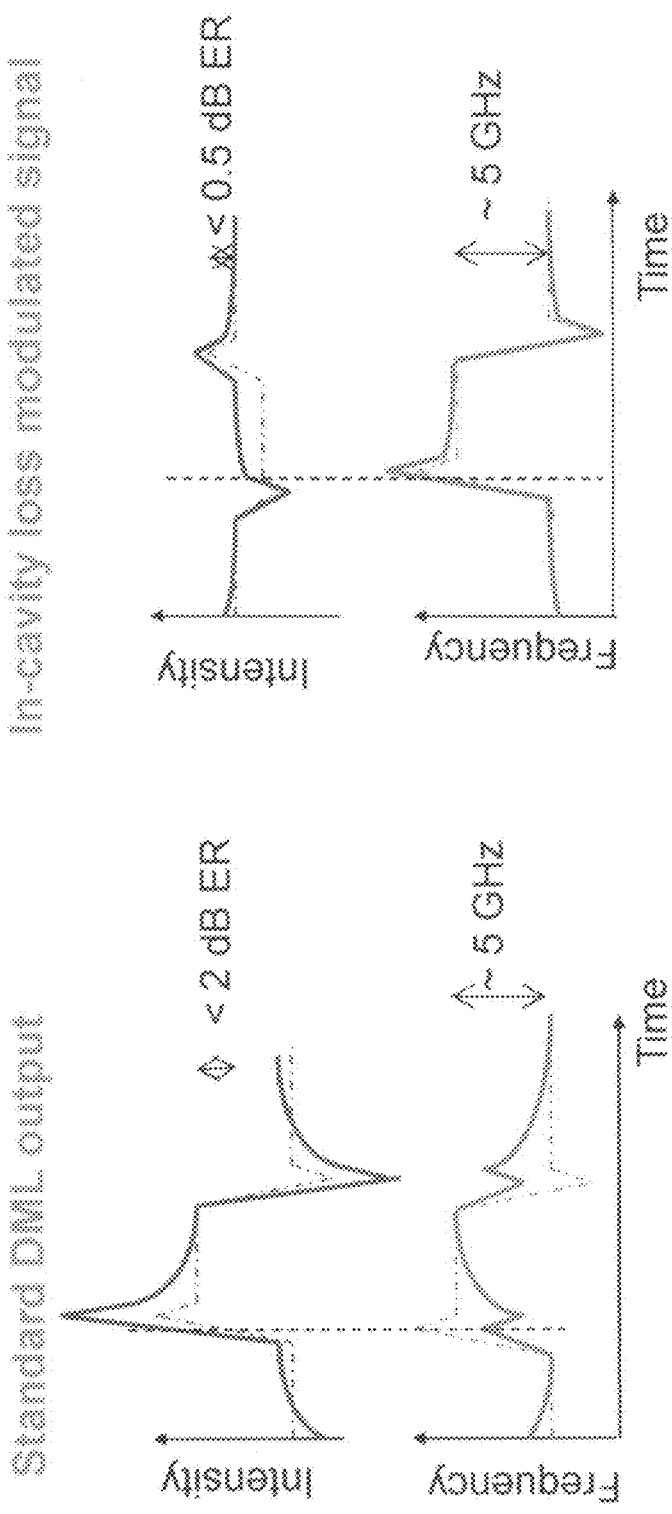
FIG. 15 shows the distortion in intensity and chirp caused by operating the SOA in saturation for both a standard DML signal and an in-cavity loss modulated signal.

First we consider the amplitude and chirp of a directly modulated laser before and after a saturated SOA. FIG. 14a shows the output of a directly modulated laser (DML). In this case, the higher intensity (i.e., the 1's state) is blue shifted in frequency relative to the lower intensity 0 state; this characteristic of the adiabatic chirp for the DML. There is also a blue shifted "overshooting" in the leading edge of the frequency waveform; i.e. at the 0 to 1 transitions, and red shifted "undershooting" in the trailing edge of the frequency waveform; i.e. at the 1 to 0 transitions, which are defined as positive transient chirp. FIG. 15a, shows the output of the saturated SOA when the directly modulated laser signal is passed through it. In this case, the leading edge of the intensity modulated signal is amplified strongly while the trailing edge of the intensity modulated signal is amplified relatively less. The corresponding frequency modulated waveform at the output of the saturated SOA now shows longer rise and fall times due to the saturation of the SOA.

Figure 16:
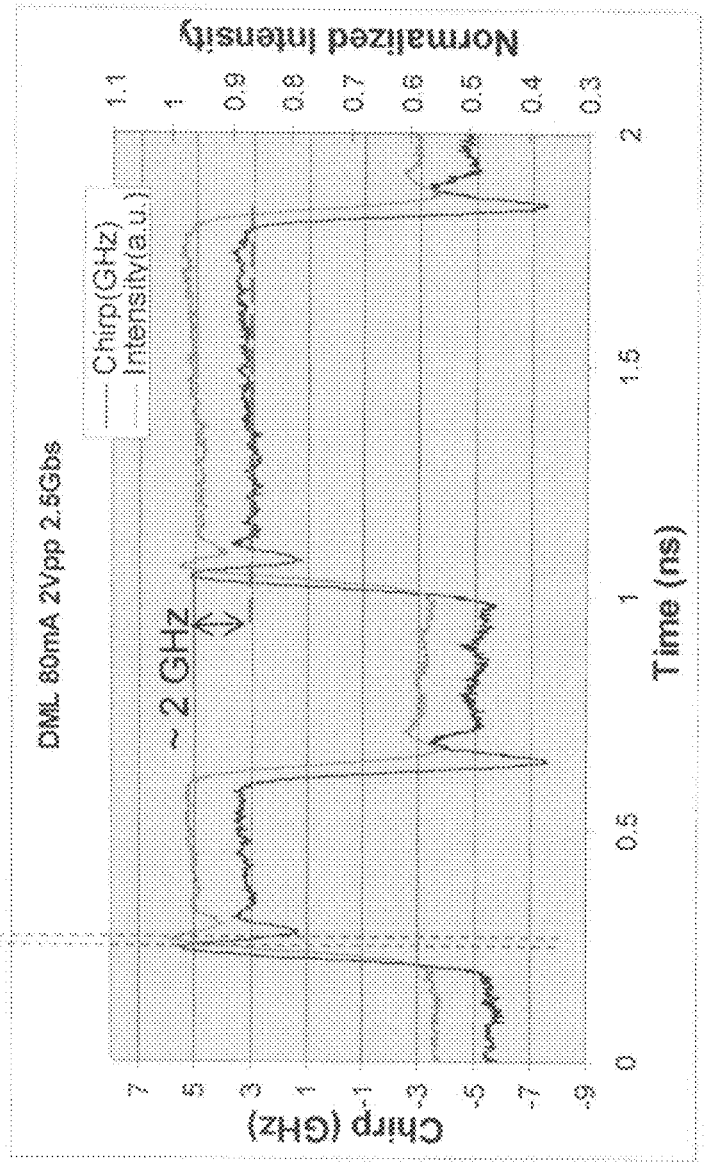
FIG. 16 shows experimental evidence for a standard DML signal (2 Vpp at 2.5 Gb/s)

In FIG. 16, there is shown the experimentally-observed intensity and chirp waveforms of a directly modulated DFB laser. The bias is 80 mA and the modulation voltage is 2 vpp at 2.5 Gb/s. The extinction ratio of intensity modulation is 3.5 dB. The adiabatic chirp component of the FM is 8 GHz. From FIG. 16, it can be seen that for a directly modulated laser, the transient chirp peak is higher in frequency by 2 GHz relative to the adiabatically chirped signal for a steady state of the 1's bit.

Figure 17:
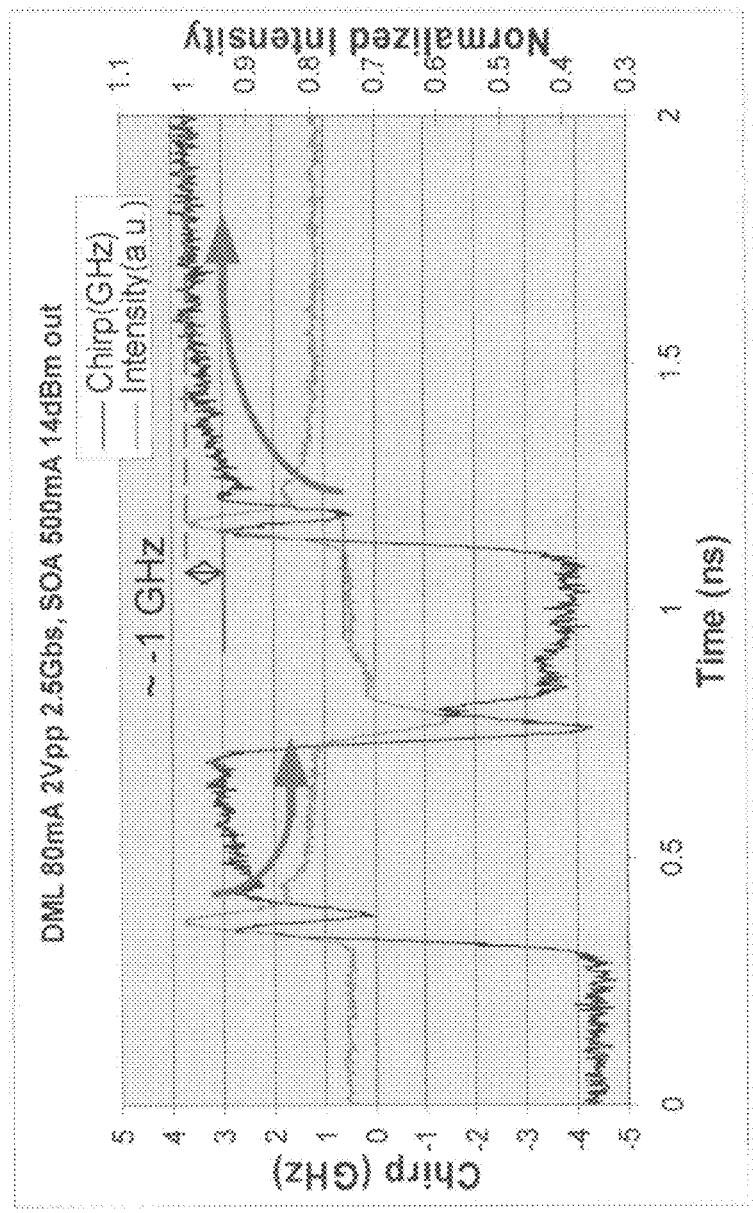
FIG. 17 shows how a deeply saturated SOA acts as a high-pass filter for an intensity waveform and as a low-pass filter for a frequency waveform.

FIG. 17 shows the output of a saturated SOA when the directly modulated signal of FIG. 16 was passed through it. In this example bias to the SOA is 500 mA and the output power is 14 dBm. The incident power to the SOA from the DFB laser is adjusted so as to adjust the saturation of the SOA to be at an 8 dB compression point for the gain. Note that the transient chirp in the leading edge is pulled toward the red shifted frequency due to the negative transient chirp created by the saturated SOA. Negative transient chirp is defined as a red shifted transient chirp at the 0 to 1 transitions and a blue shifted transient chirp at the 1 to 0 transitions. In this case, the peak transient chirp is lower in frequency by 1 GHz relative to the adiabatically chirped component of the 1 bits. The time constant of gain recovery of the SOA can be seen to be ~300 ps in this case. Such a slow time constant is detrimental to the transmission at 10 Gb/s or higher. This is a known problem for conventional transmission using saturated SOAs. In prior art systems, in order to avoid this problem, the power for the incoming signal is conventionally limited to level which is lower than a certain saturation point of the SOA, for example, a 3 dB saturation point, so as to ensure linear amplification by the SOA. The input 3 dB saturation point of a SOA is defined as the input power for which the gain of the SOA is reduced by 3 dB compared to the small signal gain. This regime of operation is undesirable. To operate in the linear regime, the bias to the SOA needs to be high in order to increase the saturation power of the SOA, leading to an increase in power consumption.

Significantly, the present invention provides a novel approach to suppress the distortion in the waveform caused by a saturated SOA. Furthermore, this novel approach can be used to turn the saturation of the SOA into a benefit, by enhancing the effective modulation bandwidth of the output signal and thus allowing the SOA to be used at a saturation point as high as 8 dB.

More particularly, in the present invention, the signal transmission can be improved by utilizing an incoming digital signal having a small AM excursion, a large FM excursion, and a negative adiabatic chirp and by passing this signal through an SOA operating in saturation. A digital signal with negative adiabatic chirp is here defined as one in which the higher intensity 1 bits are red shifted relative to the lower intensity 0 bit signals which are blue shifted, In this case, the SOA in saturation acts as a high-pass filter for the input chirp waveform while the intensity waveform undergoes a reduction in extinction ratio with slightly enhanced transient spikes at the leading and trailing edges. Such an input signal with negative adiabatic chirp can be generated by modulating the loss in a laser cavity as previously discussed.

In the Chirp Managed Laser application, where an FM and AM modulated signal is passed though the transmission edge of an optical spectrum re-shaper filter (OSR), FM is converted into AM, resulting in a high extinction ratio required for high optical transmission. The distortion in intensity is removed by the optical bandpass filter (also known as the optical spectrum reshaper, or OSR) because the high FM converted into AM dominates the waveform after the optical bandpass filter. The overshooting in the FM waveform caused by the high-pass effect of the saturated SOA is counteracted by the bandpass effect of the optical filter, resulting in a wide "opened eye" with a high extinction ratio and substantially free of distortion. Thus, the eye margin at the output of the OSR can be improved by combining the OSR with a saturated SOA for a CML application when a negative adiabatic chirp is used at its input.

Further details of using intra-cavity loss modulation in combination with a saturated SOA will now be provided.

In the present invention, modulation in the CML transmitter can be produced by the modulation of loss in the cavity of the laser instead of, for example, modulation of gain by current. In a more general sense, in the present invention, any AM-FM modulation formats where the adiabatic chirp is negative; i.e. the higher intensity 1 bits are red shifted relative to the lower intensity 0 bits, which are blue shifted may be used in combination with a saturated SOA to provide improved transmission, as described in this invention. By way of example but not limitation, LN (lithium niobate) modulators for AM and FM modulation can be used to generate AM-FM co-modulation signals with any arbitrary phase relation between the AM and FM signals. Thus, an LN modulator with proper phase relation between the AM and FM signals can be used in combination with a saturated SOA in accordance with the present invention. As another example, the direct modulation of a DFB laser, followed by an EA modulator, can be used to (i) generate adiabatic chirp by the DFB laser and (ii) then reduce the intensity for the high frequency bit by the EA modulator.

The modulation of loss in the laser cavity is achieved by integrating an electro-absorption (EA) modulator section in the laser cavity or splitting the gain section contact into small sections where a reverse voltage is applied so as to induce loss by absorption. In the case of coupled cavity lasers (e.g., VCSEL's with additional mirrors, DFBs integrated with an additional passive section with reflection at the facet), direct modulation of the gain section generates adiabatic chirp, and then this is converted into in-cavity loss modulation by the frequency dependent mirror loss of the cavity. In this case, a high FM modulation with an inverted AM-FM relation (i.e., a negative adiabatic chirp) can be generated by direct modulation of the gain section. In these modulation schemes, high FM efficiency of around 20 GHz/V can be obtained, resulting in only ~0.5 dB ER for 5 GHz of adiabatic chirp (see FIG. 14b). In this case, the chirp created by a saturated SOA creates a high-pass effect for the chirp waveform (see FIG. 15b). As noted above, this is beneficial for high bit rate transmission systems. Conventionally, it is difficult to use a saturated SOA for 10 Gb/s transmission systems, however, in the present invention, the saturated SOA improves the performance of transmission systems operating at 10 Gb/s or faster.

Figure 18:
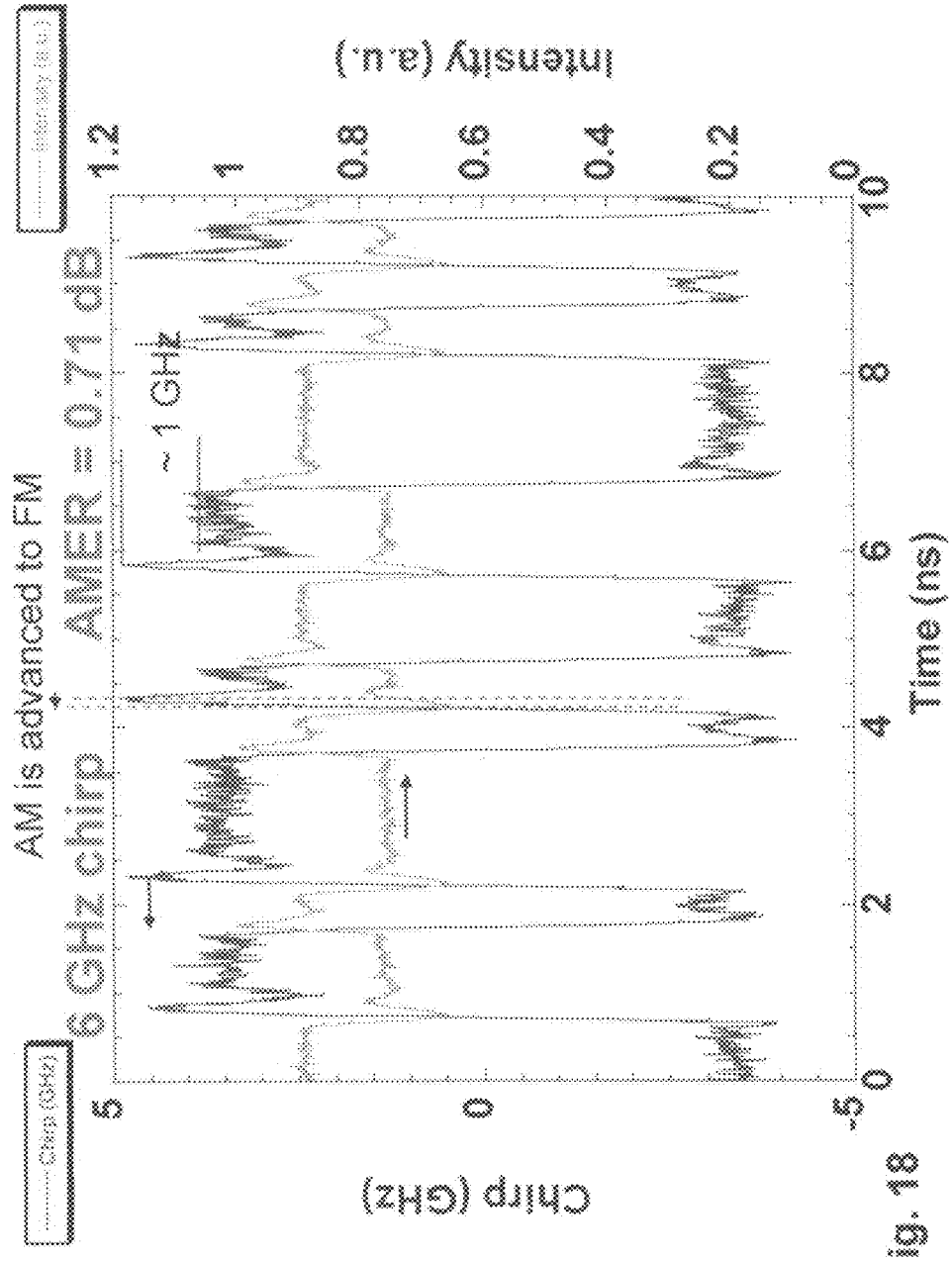
FIG. 18 shows direct output from an in-cavity loss modulated signal.
Figure 19:
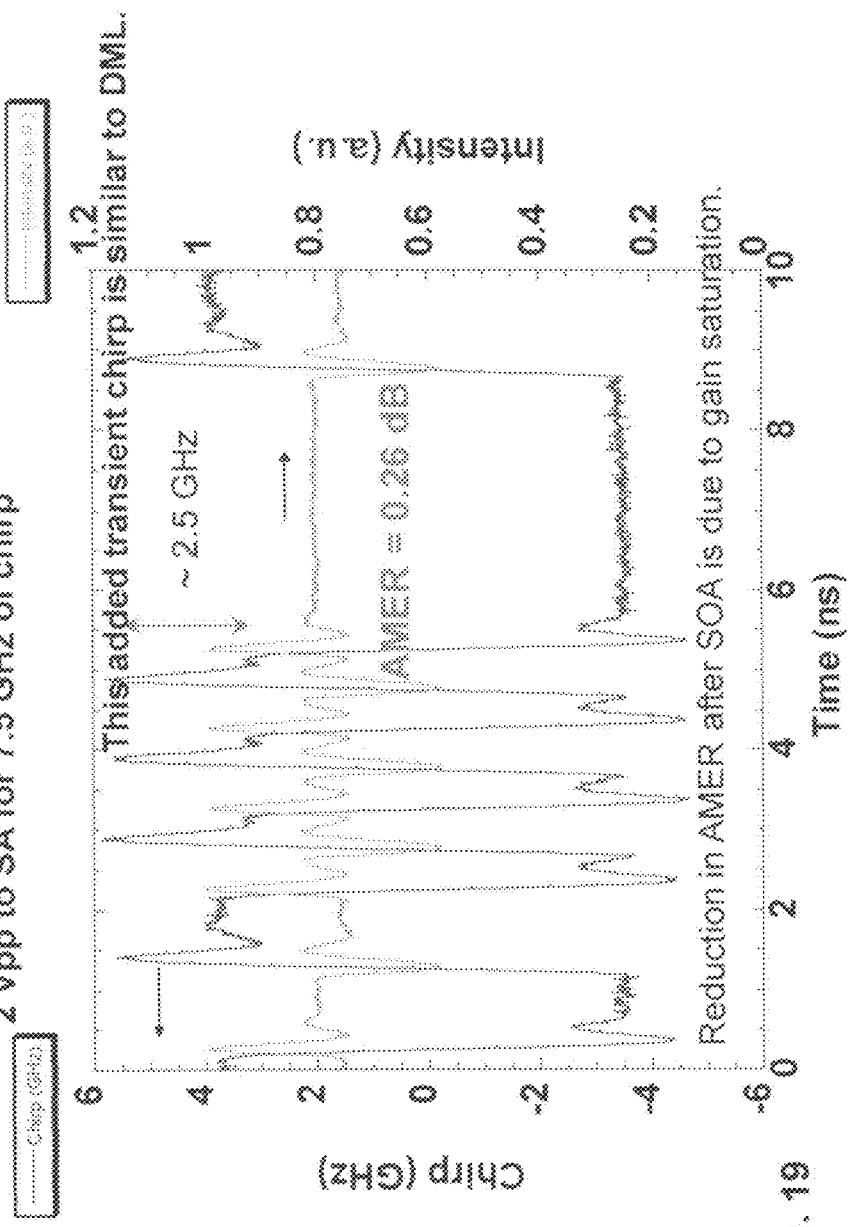
FIG. 19 shows an in-cavity loss modulated signal after passage through a saturated SOA.

As an example of experimental evidence, an in-cavity loss modulated signal is shown in FIG. 18. The laser is a intra-cavity loss modulated DBR laser with a gain length of 500 um and saturable absorber (SA) length of 30 um. The reverse bias to the SA and the RF were applied to the SA section for in-cavity loss modulation. The gain bias is 130 mA and the modulation voltage is 1.3 Vpp at 2.5 Gb/s. The reverse DC bias to the SA is −0.66 V. The adiabatic chirp for this laser is 6 GHz and the corresponding extinction ratio (ER) is 0.71 dB. The adiabatic chirp is negative. As shown in FIG. 18, using this in-cavity loss modulation approach, for a steady state of 1's bit, the transient chirp peak is 1 GHz higher in frequency than the corresponding adiabatically-chirped signal The effect of passing the loss modulated signal through a saturated SOA can now be observed. In FIG. 19, the incoming signal power to a SOA is adjusted to set the saturation point to 8 dB. The ER of the amplitude modulation (AMER) after the saturated SOA is further reduced to 0.26 dB due to strong saturation in the SOA. In the leading and trailing edges, transient spikes in the intensity waveform are observed, since high frequency components of an input signal to the SOA do not experience saturation, as is understood in the art. In the chirped waveform, the transient chirp components are pronounced in both the leading and trailing edges, because the transient chirps in the loss-modulated laser and in the SOA are both negative transient chirp, as defined above. The transient chirp peak is higher in frequency by 2.5 GHz relative to the adiabatically chirped signal for the steady state of 1's bit. This enhancement in transient chirp is beneficial, since it improves the eye mask margin in a CML application, or in a more general transmission system, operating faster than 10 Gb/s.

The magnitude of the adiabatic chirp of the incoming signal relative to the transient chirp created by the SOA can be tailored by saturation of the SOA, which depends on SOA bias and the power of the signal input to the SOA, and the adiabatic chirp and ER (extinction ratio) of the incoming signals. In the experimental evidence shown in FIGS. 16 and 17, the saturation of the SOA is 8 dB, AMER is 3.5 dB, FM is 8 GHz, and the transient chirp ($TC_{SOA}$) caused by the SOA is −3 GHz at the leading edge with a time constant of 300 ps. If the acceptable range of $TC_{SOA}$ is −1 GHz, then the saturation of the SOA needs to be reduced to 3 dB or the AMER needs to be 1 dB. On the other hand, for a loss-modulated signal (or essentially an AM-FM inverted signal) such as that shown in FIGS. 18 and 19, the saturation of the SOA is 8 dB, AMER is −0.72 dB (negative for AM-FM inverted signal), FM is 6 GHz, and the transient chirp ($TC_{SOA}$) caused by the SOA is +1.5 GHz (and total transient chirp is +2.5 GHz). This slight increase in transient chirp is an advantage for high-bit rate transmission systems, including CML formats. By way of example but not limitation, an acceptable range of transient chirp, in a CML application is ~4 GHz. This means that AMER can be ~−1.5 dB while saturation of SOA can be 8 dB. The use of such a highly saturated SOA is advantageous for high output power from the SOA or, in turn, low power consumption in the SOA for a given output power.

As an example of low power consumption of the SOA, to have a 13 dBm output power from the SOA, the 3-dB saturation power of the SOA can be as low as 5 dB. Such a SOA can be easily designed using a short SOA length (~300 um) with low bias current (~150 mA). On the other hand, the amplification of a standard DML signal requires an SOA with a saturation power of 16 dBm to generate the same output power. This may require a 1.5-mm SOA length with 700 mA injection current.

Figure 20:
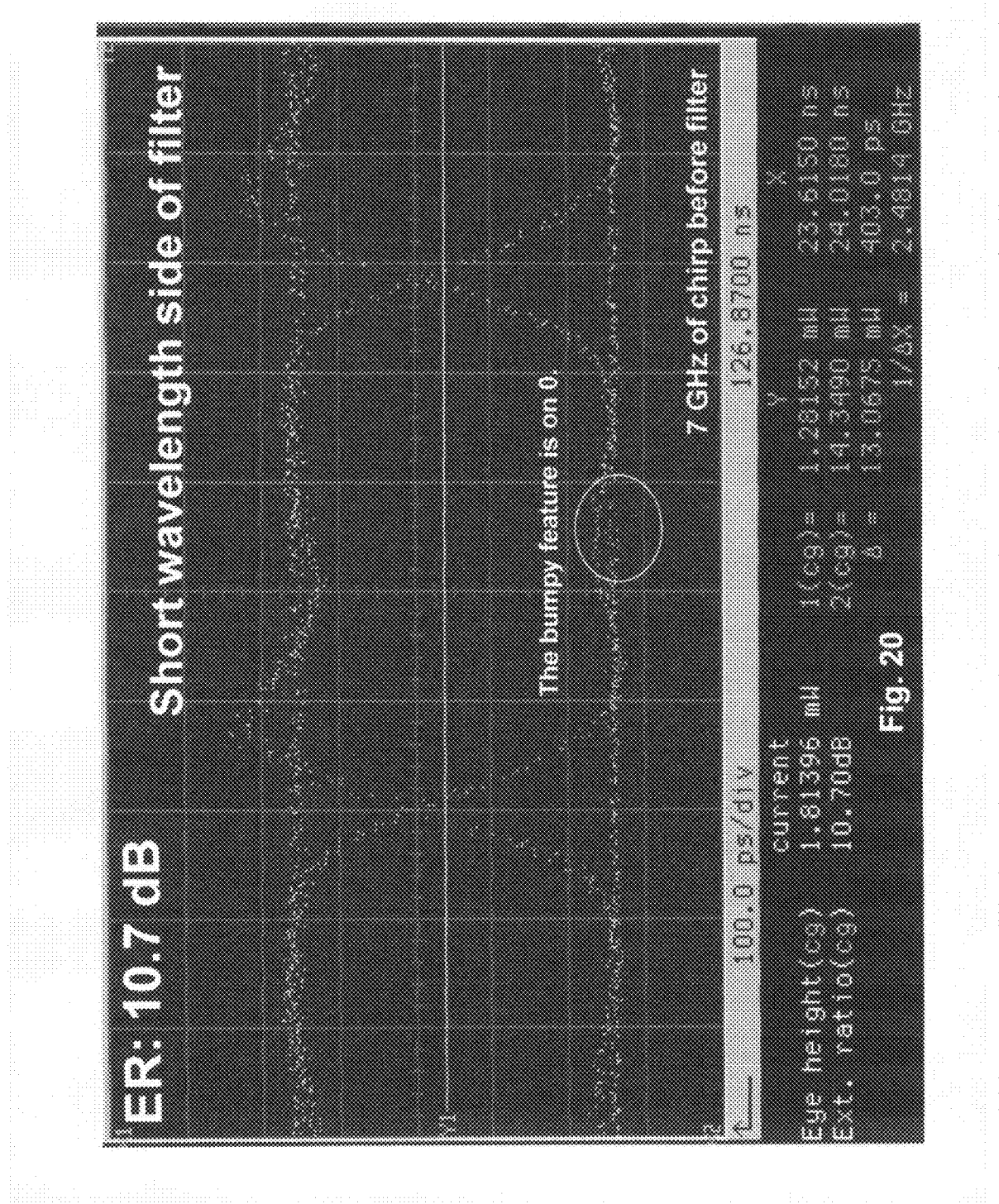
Figure 21:
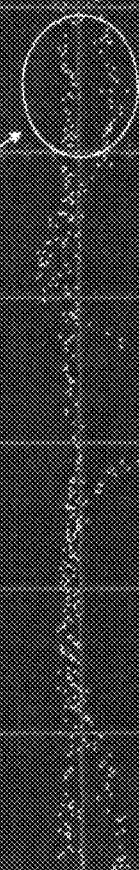
FIG. 21 shows the signal on the long wavelength side of the OSR filter.

The advantage of transient chirp for the application of CML is demonstrated in the following experimental results. By passage of the signal through an optical spectrum re-shaper (OSR), as used in a CML transmitter, FM is converted into AM. Due to high FM and low AM for the in-cavity loss modulated laser, SOA-induced distortion in the FM component is small relative to the original larger FM component, with a feature described by negative alpha parameters. This transient chirp (overshooting in the leading edges and under-shooting in the trailing edges) induced by a saturated SOA is counteracted by an OBF (optical bandpass filter, also known as an optical spectrum reshaper, or ORS), resulting in a wide open eye after the OSR (FIGS. 20 and 21). In FIGS. 20 and 21, the signal is passed on the short (FIG. 20) or long (FIG. 21) wavelength side of the OSR. The output of the OSR is similar for short wavelength side and long wavelength side of the OSR because the AMER is low (~0.2 dB) at the input. The ER after the OSR is the sum of the original AMER and the ER enhancement by FM-AM conversion of the OSR. If the AMER and the OSR-induced ER are the same sign, then the ER at the output of the OSR increases. If the AMER and the OSR-induced ER are opposite signs, then the ER at the output of the OSR decreases. As an example, with a DFB laser, the AMER is 3 dB and the OSR-induced ER is 9.1 dB if FM is 7 GHz and the slope of OSR is 1.3 dB/GHz. In this case, the total ER is 12.1 dB (3 dB+9.1 dB) if incoming signal is positioned on the long wavelength side of the OSR. Or the total ER is −6.1 dB (3 dB−9.1 dB, where the negative sign means that the data information is inverted) if incoming signal is positioned on the short wavelength side of OSR having the same slope of −1.3 dB/GHz. Therefore, the resultant ER is not as high on the short wavelength side. It is still possible to enhance the ER by using the larger slope of the OSR, however, the eye may show noise and jitter when the slope of the OSR increases. On the other hand, for a loss modulated signal, the ER after the SOA is reduced to 0.2 dB. In this case, high ER can be obtained on either side of the OSR. In FIG. 20, on the short wavelength side of the OSR, the ER is 10.7 dB while in FIG. 21, on the long wavelength side of the OSR, the ER is 12.55 dB. Also, the eye diagrams in FIGS. 20 and 21 show slight overshooting/undershooting. This helps to open the eye and improves the mask margin. Due to the moderate slope of the OSR (~1.5 dB/GHz) and the flatness of the FM response for a loss-modulated laser, the jitter in the eye is small.

Figure 22:
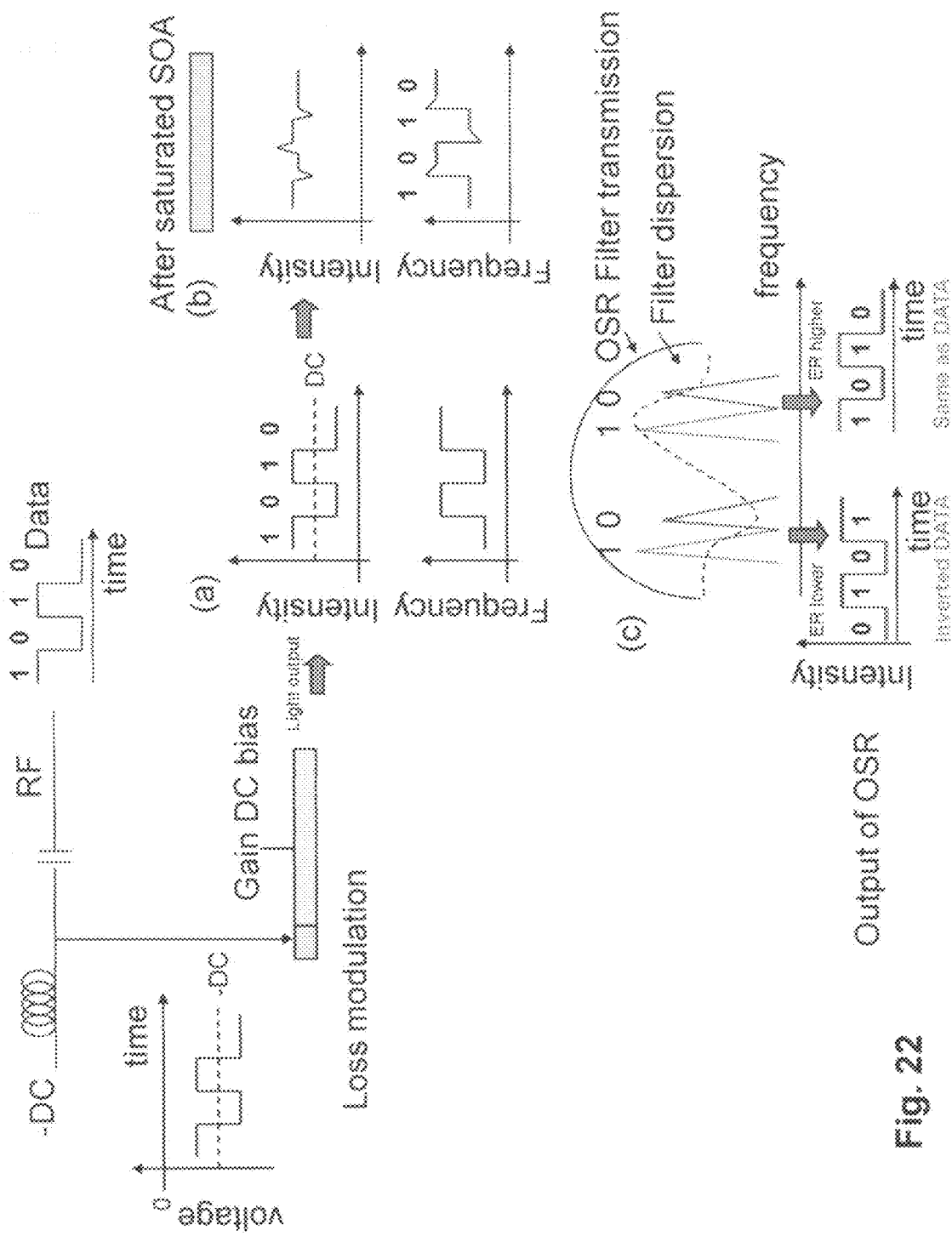
FIG. 22 shows how data are converted through a loss-modulated laser, a saturated SOA and an OSR.

The low ER for signal after a saturated SOA enables either side of the OSR to be used to achieve high ER and low jitter. FIG. 22 shows how data are converted through a loss-modulated laser, saturated SOA and OSR. When data is coming into the loss-modulated laser, 1 bits correspond to high intensity and red shifted chirp (see FIG. 22a). After the saturated SOA (FIG. 22b), the ER is suppressed in the AM component and transient chirp is added to the FM component.

If wavelength locking of the laser to the OSR is achieved on the high frequency side of the OSR, the output has the same logical polarity as the original data. In this case, the dispersion of the OSR is the same sign as the dispersion of standard transmission fiber around 1550 nm, therefore, the total dispersion for the OSR and transmission fiber increases. If the fiber link has overcompensation (negative dispersion), the transmission performance improves because the OSR reduces the total dispersion. Slightly high ER can be obtained since the AMER and the OSR-induced ER by FM-AM conversion has the same sign.

If wavelength locking of the laser to the OSR is achieved on the lower frequency side of the OSR, the output has an inverted polarity relative to the original data. This can be corrected by using DATA BAR from the RF output port of the driver. The dispersion of the OSR is the opposite sign to the dispersion of standard transmission fiber (STF) around 1550 nm, therefore, the total dispersion for the OSR and transmission fiber reduces and the transmission performance is improved in STF. Slightly lower ER will be obtained since the AMER and OSR-induced ER by FM-AM conversion has the opposite sign.

Figure 23:
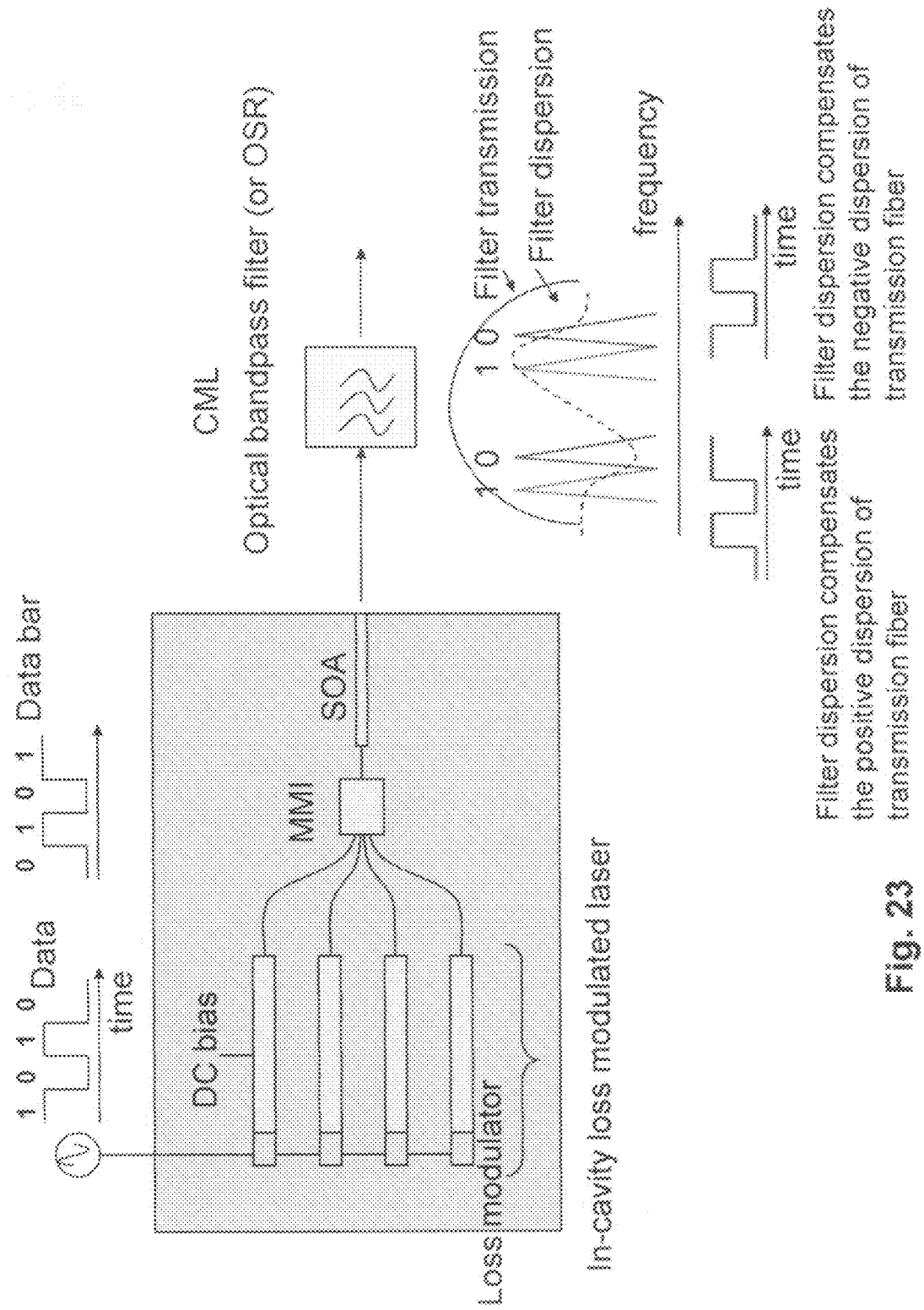
FIG. 23 shows an arrangement where the outputs of a loss-modulated laser array are combined with an MMI and then amplified with an SOA, all being integrated monolithically.

FIG. 23 shows the case where the output of a loss-modulated laser array is combined with a multi-mode interference (MMI) and then amplified with a SOA, all integrated monolithically. In tunable applications covering the full C band, a laser array is often used where the tuning range for each laser stripe is limited. In order to combine the output from the laser stripes, an MMI or arrayed waveguide grating (AWG) can be used at the expense of loss for the combiner. Monolithic integration of an SOA to compensate for this loss is possible in view of the present invention.

MODIFICATIONS

It will be understood that many changes in the details, materials, steps and arrangements of parts, which have been herein described and illustrated in order to explain the nature of the invention, may be made by those skilled in the art without departing from the principles and scope of the present invention.

What is claimed is:

1. A fiber optic communication system comprising:
an optical signal source adapted to receive a binary first signal and generate a binary second signal, wherein the binary first signal has an amplitude modulated component, wherein the binary second signal has an amplitude modulated component and a frequency modulated component, and further wherein the binary second signal is characterized in that the higher intensity 1 bits are red shifted relative to the lower intensity 0 bits;
a semiconductor optical amplifier (SOA) adapted to receive the binary second signal and generate a binary third signal, wherein the binary third signal has an amplitude modulated component and a frequency modulated component, and further wherein the semiconductor optical amplifier operates in saturation; and
an optical spectrum reshaper (OSR) adapted to reshape the binary third signal into a binary fourth signal, wherein the binary fourth signal has an amplitude modulated component and a frequency modulated component.

2. A fiber optic communication system according to claim 1 wherein the optical signal source comprises a laser, and further wherein the binary second signal is generated through intra-cavity loss modulation of the laser.

3. A fiber optic communication system according to claim 2 wherein the laser comprises a cavity including a semiconductor material, and further wherein the intra-cavity loss modulation is achieved by applying an appropriate voltage to the semiconductor material so as to effect a change in the absorption of the semiconductor material.

4. A fiber optic communication system according to claim 3 wherein the intra-cavity loss modulation is achieved by using one from the group consisting of: (i) the quantum confined stark effect (QCSE); and (ii) the Franz-Keldysh effect.

5. A fiber optic communication system according to claim 2 wherein the laser comprises one from the group consisting of: (i) distributed feedback (DFB) lasers; (ii) distributed Bragg reflector (DBR) lasers; (iii) sampled grating distributed Bragg reflector (SG-DBR) lasers; and (iv) Y branch DBR lasers.

6. A fiber optic communication system according to claim 2 wherein the laser comprises one from the group consisting of: (i) external cavity lasers with fiber Bragg gratings; (ii) external cavity lasers with ring resonators; (iii) external cavity lasers with planar lightwave circuit (PLC) Bragg gratings; (iv) external cavity lasers with arrayed waveguide gratings (AWG); (v) external cavity lasers with grating filters; (vi) vertical cavity surface emitting lasers (VCSEL); and (vii) Fabry Perot lasers.

7. A fiber optic communication system according to claim 1 wherein the optical spectrum reshaper (OSR) comprises a filter.

8. A fiber optic communication system according to claim 7 wherein the filter has a high frequency side and a low frequency side, and further wherein the system is configured to use the high frequency side of the filter so as to compensate for negative dispersion in a downstream fiber transmission link.

9. A fiber optic communication system according to claim 1 wherein the optical signal source comprises a plurality of lasers, and further wherein the output of each of the lasers is directed into the input of the semiconductor optical amplifier (SOA).

10. A fiber optic communication system according to claim 9 wherein the plurality of lasers together cover a range of wavelengths.

11. A method for transmitting a signal, comprising:
receiving a binary first signal having an amplitude modulated component and generating a binary second signal having an amplitude modulated component and a frequency modulated component, wherein the binary second signal is characterized in that the higher intensity 1 bits are red shifted relative to the lower intensity 0 bits;
passing the binary second signal through a semiconductor optical amplifier (SOA) operating in saturation so as to generate a binary third signal, wherein the binary third signal has an amplitude modulated component and a frequency modulated component; and
reshaping the binary third signal into a binary fourth signal, wherein the binary fourth signal has an amplitude modulated component and a frequency modulated component.

12. A method according to claim 11 wherein the binary second signal is generated by a laser utilizing intra-cavity loss modulation.

13. A method according to claim 12 wherein the laser comprises a cavity including a semiconductor material, and further wherein the intra-cavity loss modulation is achieved by applying an appropriate voltage to the semiconductor material so as to effect a change in the absorption of the semiconductor material.

14. A method according to claim 13 wherein the intra-cavity loss modulation is achieved by using one from the group consisting of: (i) the quantum confined stark effect (QCSE); and (ii) the Franz-Keldysh effect.

15. A method according to claim 12 wherein the laser comprises one from the group consisting of: (i) distributed feedback (DFB) lasers; (ii) distributed Bragg reflector (DBR) lasers; (iii) sampled grating distributed Bragg reflector (SG-DBR) lasers; and (iv) Y branch DBR lasers.

16. A method according to claim 12 wherein the laser comprises one from the group consisting of: (i) external cavity lasers with fiber Bragg gratings; (ii) external cavity lasers with ring resonators; (iii) external cavity lasers with planar lightwave circuit (PLC) Bragg gratings; (iv) external cavity lasers with arrayed waveguide gratings (AWG); (v) external cavity lasers with grating filters; (vi) vertical cavity surface emitting lasers (VCSEL); and (vii) Fabry Perot lasers.

17. A method according to claim 11 wherein reshaping the binary third signal into a binary fourth signal is achieved by passing the binary third signal through a filter.

18. A method according to claim 17 wherein the filter has a high frequency side and a low frequency side, and further wherein the high frequency side of the filter is used so as to compensate for negative dispersion in a downstream fiber transmission link.

19. A method according to claim 11 wherein the optical signal source comprises a plurality of lasers, and further wherein the output of each of the lasers is directed into the input of the semiconductor optical amplifier (SOA).

20. A method according to claim 19 wherein generating the binary second signal comprises (i) providing a plurality of optical signal sources covering a range of wavelengths, (ii) selecting one of the plurality of optical signal sources based upon the wavelength desired for the binary second signal, and (iii) directing the binary first signal into the selected optical signal source so as to generate the desired binary second signal.

* * * * *